(12) United States Patent
Yew et al.

(10) Patent No.: US 12,232,307 B2
(45) Date of Patent: Feb. 18, 2025

(54) DUMMY METAL BONDING PADS FOR UNDERFILL APPLICATION IN SEMICONDUCTOR DIE PACKAGING AND METHODS OF FORMING THE SAME

(71) Applicant: Taiwan Semiconductor Manufacturing Company Limited, Hsinchu (TW)

(72) Inventors: Ming-Chih Yew, Hsinchu (TW); Shu-Shen Yeh, Hsinchu (TW); Chin-Hua Wang, New Taipei (TW); Po-Yao Lin, Zhudong Township (TW); Shin-Puu Jeng, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/230,782

(22) Filed: Aug. 7, 2023

(65) Prior Publication Data
US 2023/0380126 A1    Nov. 23, 2023

Related U.S. Application Data

(62) Division of application No. 17/462,066, filed on Aug. 31, 2021.

(51) Int. Cl.
*H10B 10/00*    (2023.01)
*H01L 21/56*    (2006.01)
(Continued)

(52) U.S. Cl.
CPC .......... *H10B 10/00* (2023.02); *H01L 21/563* (2013.01); *H01L 23/5283* (2013.01);
(Continued)

(58) Field of Classification Search
CPC ... H10B 10/00; H01L 21/563; H01L 23/5283; H01L 23/535; H01L 23/5386;
(Continued)

(56) References Cited

U.S. PATENT DOCUMENTS 8,901,730 B2 * 12/2014 Liu .......................... H01L 23/52
                                                    438/109
9,793,246 B1 * 10/2017 Tseng .................. H01L 23/3128
(Continued)

FOREIGN PATENT DOCUMENTS

JP         2018125370 A        8/2018

*Primary Examiner* — Duy T Nguyen
(74) *Attorney, Agent, or Firm* — The Marbury Law Group, PLLC

(57) ABSTRACT

A fan-out package includes a redistribution structure having redistribution-side bonding structures, a plurality of semiconductor dies including a respective set of die-side bonding structures that is attached to a respective subset of the redistribution-side bonding structures through a respective set of solder material portions, and an underfill material portion laterally surrounding the redistribution-side bonding structures and the die-side bonding structures of the plurality of semiconductor dies. A subset of the redistribution-side bonding structures is not bonded to any of the die-side bonding structures of the plurality of semiconductor dies and is laterally surrounded by the underfill material portion, and is used to provide uniform distribution of the underfill material during formation of the underfill material portion.

20 Claims, 22 Drawing Sheets

(51) Int. Cl.
*H01L 23/00* (2006.01)
*H01L 23/528* (2006.01)
*H01L 23/535* (2006.01)
*H01L 23/538* (2006.01)
*H01L 25/065* (2023.01)

(52) U.S. Cl.
CPC ........ *H01L 23/535* (2013.01); *H01L 23/5386* (2013.01); *H01L 24/09* (2013.01); *H01L 24/32* (2013.01); *H01L 25/0655* (2013.01); *H01L 2224/02379* (2013.01); *H01L 2224/32137* (2013.01)

(58) Field of Classification Search
CPC ..... H01L 24/09; H01L 24/32; H01L 25/0655; H01L 2224/02379; H01L 2224/32137; H01L 23/5384; H01L 23/5385; H01L 23/49811; H01L 23/5383; H01L 25/50; H01L 25/0657; H01L 2224/95; H01L 21/561; H01L 21/568; H01L 23/562; H01L 24/13; H01L 24/29; H01L 24/81; H01L 2224/13101; H01L 2225/06513; H01L 2225/06517; H01L 2225/06565; H01L 24/83; H01L 24/92; H01L 25/0652; H01L 24/16; H01L 2224/26175; H01L 2224/27013; H01L 2224/81801; H01L 2224/83007; H01L 2224/92125; H01L 24/97; H01L 24/73; H01L 2224/16145; H01L 2224/16225; H01L 2224/32145; H01L 2224/32225; H01L 2224/73204; H01L 2224/8385; H01L 2224/97; H01L 2924/15311; H01L 2924/181; H01L 2924/18161; H01L 23/49838; H01L 23/18; H01L 25/18
USPC .......................................................... 257/737
See application file for complete search history.

(56) References Cited

U.S. PATENT DOCUMENTS

| | | | |
|---|---|---|---|
| 2010/0171208 A1* | 7/2010 | Fujii | H01L 23/3128 257/737 |
| 2012/0098123 A1* | 4/2012 | Yu | H01L 23/49827 257/E23.06 |
| 2018/0366439 A1* | 12/2018 | Lin | H01L 23/49838 |
| 2021/0202440 A1* | 7/2021 | Chang Chien | H01L 23/481 |

* cited by examiner

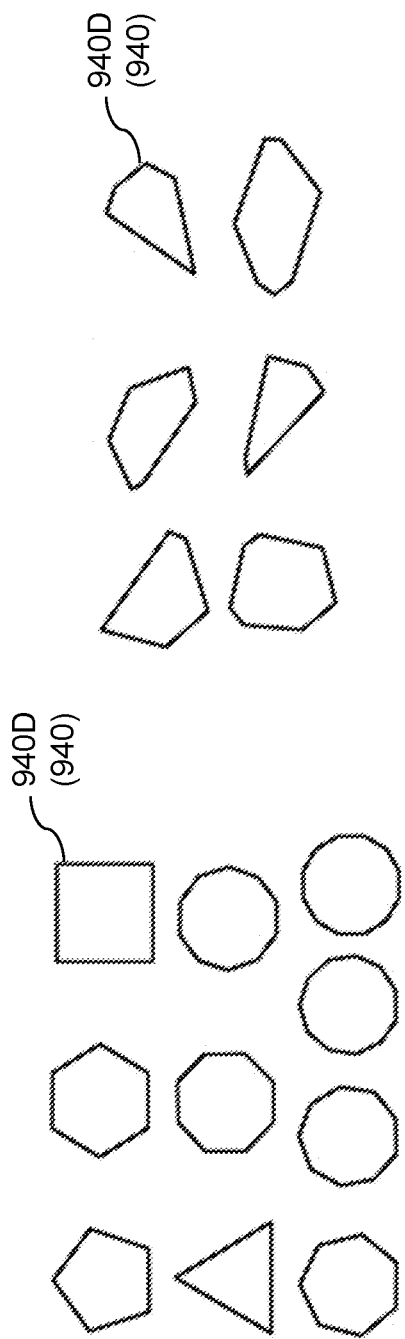

DUMMY METAL BONDING PADS FOR UNDERFILL APPLICATION IN SEMICONDUCTOR DIE PACKAGING AND METHODS OF FORMING THE SAME

RELATED APPLICATIONS

This application is a divisional application of U.S. application Ser. No. 17/462,066 entitled "Dummy Metal Bonding Pads for Underfill Application in Semiconductor Die Packaging and Methods of Forming the Same," filed on Aug. 31, 2021, the entire contents of which is incorporated herein by reference for all purposes.

BACKGROUND

Interfaces between a fan-out wafer level package (FOWLP) and a molding compound material portion are subjected to mechanical stress during subsequent handling of an assembly of the FOWLP, the underfill material portion, and a packaging substrate, such as attachment of the packaging substrate to a printed circuit board (PCB). In addition, interfaces between a FOWLP and an underfill material portion are subjected to mechanical stress during use within a computing device, such as when the FOWLP heats up during usage and mismatch in thermal expansion of components of the FOWLP induces thermal stress or when a mobile device is accidently dropped to cause a mechanical shock during usage. Cracks may be formed in the underfill material, and may induce additional cracks in a semiconductor die, solder material portions, redistribution structures, and/or various dielectric layers within a semiconductor die or within a package substrate. Thus, formation of cracks in the underfill material needs to be suppressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A illustrate top-down views of alternative shapes for the first solder material portions according to an embodiment of the present disclosure.

FIG. 5B illustrate top-down views of additional alternative shapes for the first solder material portions according to an embodiment of the present disclosure.

DETAILED DESCRIPTION

Figure 1:
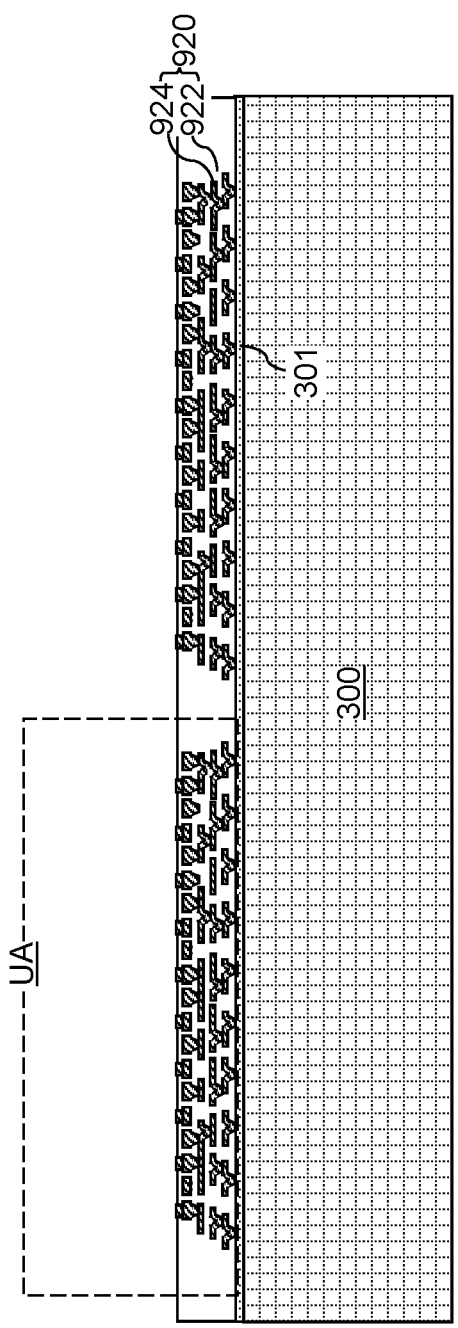
FIG. 1 is a vertical cross-sectional view of a region of an exemplary structure that includes a first carrier substrate and redistribution structures according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to uniform application of an underfill material in semiconductor die packaging. Generally, the methods and structures of the present disclosure may be used to provide a chip package structure such as a fan-out wafer level package (FOWLP) or a fan-out panel level package (FOPLP). While the present disclosure is described using an FOWLP configuration, the methods and structures of the present disclosure may be implemented in an FOPLP configuration or any other fan-out or fan-in package configuration.

Metal bonding structures on semiconductor dies and redistribution structures may increase the capillary force during application of an underfill material. The increased capillary force may be advantageously used to enhance uniformity of the underfill material distribution around the metal bonding structures in a die-to-die gap or in a die-to-package gap (such as a die-to-chip-scale-package gap). According to an aspect of the present disclosure, the flow uniformity of an underfill material may be enhanced using dummy metal bonding structures and/or dummy solder material portions. Void formation within an underfill material portion within a die-to-die gap or a die-to-package gap may be avoided or reduced through use of the dummy structures of the present disclosure that enhance the capillary force in inter-die regions.

For example, a high performance computing (HPC) package may comprise multiple semiconductor dies including at least one system-on-chip (SoC) die and at least one high bandwidth memory (HBM) die within a chiplet, such as a fan-out wafer level package. Die-to-die gaps and/or die-to-chip-scale-package gaps increase the complexity of an underfill material dispensation step. In instances in which the underfill material flows non-uniformly, voids may be formed within the underfill material portion in gap regions. Such voids in the underfill material may cause solder bridging or a "popcorn" phenomenon in which solder material portions are securely attached to metal bonding structures. The dummy structures of embodiments of the present disclosure may be used to avoid or reduce formation voids in the underfill material. The various aspects and embodiments of the methods and structures of the present disclosure are described with reference to accompanying drawings.

Referring to FIG. 1, an exemplary structure according to an embodiment of the present disclosure includes a first carrier substrate 300 and redistribution structures 920 formed on a front side surface of the first carrier substrate 300. The first carrier substrate 300 may include an optically transparent substrate such as a glass substrate or a sapphire substrate. The diameter of the first carrier substrate 300 may be in a range from 150 mm to 290 mm, and the thickness of the first carrier substrate 300 may be in a range from 500 microns to 2,000 microns, although lesser and greater thicknesses may also be used. Alternatively, the first carrier substrate 300 may be provided in a rectangular panel format.

A first adhesive layer 301 may be applied to the front-side surface of the first carrier substrate 300. In one embodiment, the first adhesive layer 301 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 301 may include a thermally decomposing adhesive material. For example, the first adhesive layer 301 may include an acrylic pressure-sensitive adhesive that decomposes at an elevated temperature. The debonding temperature of the thermally decomposing adhesive material may be in a range from 150 degrees to 200 degrees Celsius.

Redistribution structures 920 may be formed over the first adhesive layer 301. Specifically, a redistribution structure 920 may be formed within each unit area UA, which is the area of a repetition unit that is repeated in a two-dimensional array over the first carrier substrate 300. Each redistribution structure 920 may include redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 400 nm, and the copper seed layer may have a thickness in a range from 100 nm to 500 nm. The metallic fill material for the redistribution wiring interconnects 924 may include copper, nickel, or copper and nickel. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each redistribution structure 920 (i.e., the levels of the redistribution wiring interconnects 924) may be in a range from 1 to 10. Other suitable materials are within the contemplated scope of disclosure. A periodic two-dimensional array (such as a rectangular array) of redistribution structures 920 may be formed over the first carrier substrate 300. The layer including all redistribution structures 920 is herein referred to as a redistribution structure layer. The redistribution structure layer includes a two-dimensional array of redistribution structures 920.

Figure 2A:
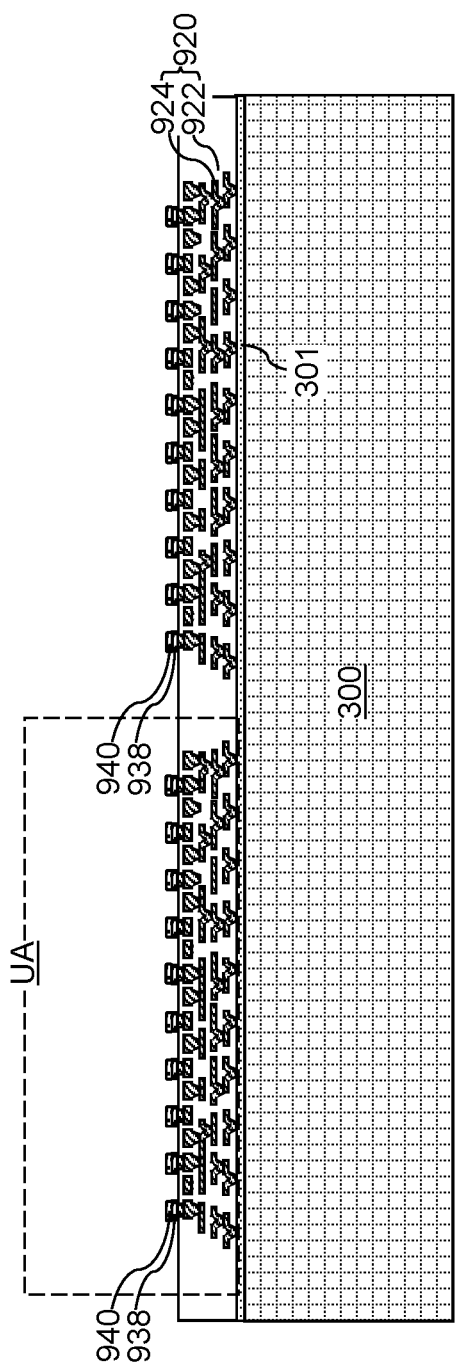
FIG. 2A is vertical cross-sectional view of a region of the exemplary structure after formation of redistribution-side bonding structures and first solder material portions according to an embodiment of the present disclosure.
Figure 2B:
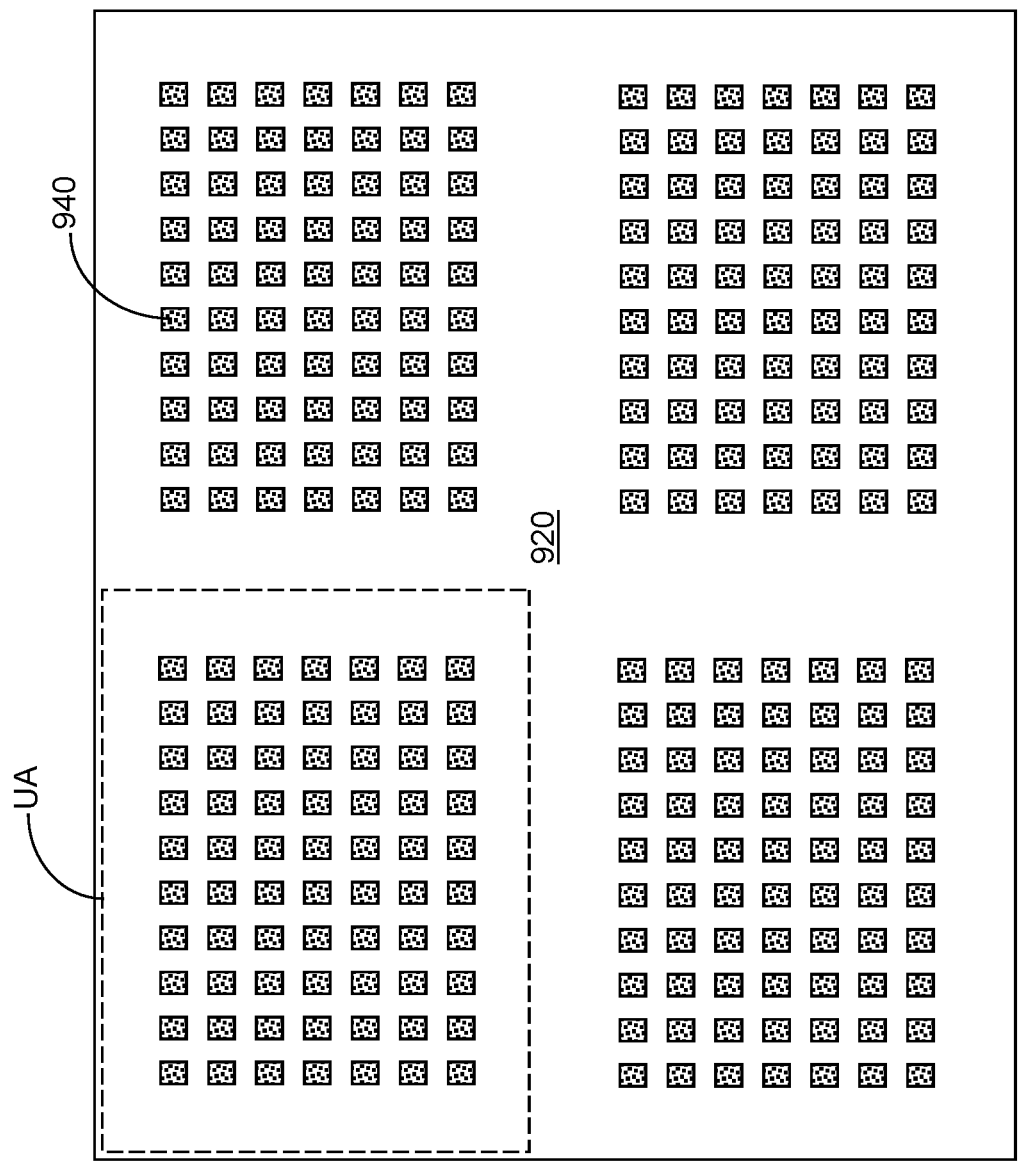
FIG. 2B is a top-down view of the region of the exemplary structure of FIG. 2A.

Referring to FIGS. 2A and 2B, at least one metallic material and a first material may be sequentially deposited over the front-side surface of the redistribution structures 920. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first material may comprise a first material suitable for C2 bonding, i.e., for microbump bonding. The thickness of the first material may be in a range from 2 microns to 30 microns, such as from 4 microns to 15 microns, although lesser and greater thicknesses may also be used.

The first material and the at least one metallic material may be patterned into discrete arrays of first solder material portions 940 and arrays of metal bonding structures, which are herein referred to as arrays of redistribution-side bonding structures 938. Each array of redistribution-side bonding structures 938 is formed within a respective unit area UA. Each array of first solder material portions 940 is formed within a respective unit area UA. Each first solder material portion 940 may have a same horizontal cross-sectional shape as an underlying redistribution-side bonding structures 938.

In one embodiment, the redistribution-side bonding structures 938 may include, and/or may consist essentially of, copper or a copper-containing alloy. Other suitable materials are within the contemplated scope of disclosure. The thickness of the redistribution-side bonding structures 938 may be in a range from 5 microns to 60 microns, although lesser or greater thicknesses may also be used. The redistribution-side bonding structures 938 may have horizontal cross-sectional shapes of rectangles, rounded rectangles, circles, regular polygons, irregular polygons, or any other two-dimensional curvilinear shape having a closed periphery. In one embodiment, redistribution-side bonding structures 938 may be configured for microbump bonding (i.e., C2 bonding), and may have a thickness in a range from 10 microns to 30 microns, although lesser or greater thicknesses may also be used. In this embodiment, each array of redistribution-side bonding structures 938 may be formed as an array of microbumps (such as copper pillars) having a lateral dimension in a range from 10 microns to 25 microns, and having a pitch in a range from 20 microns to 50 microns.

Figure 3A:
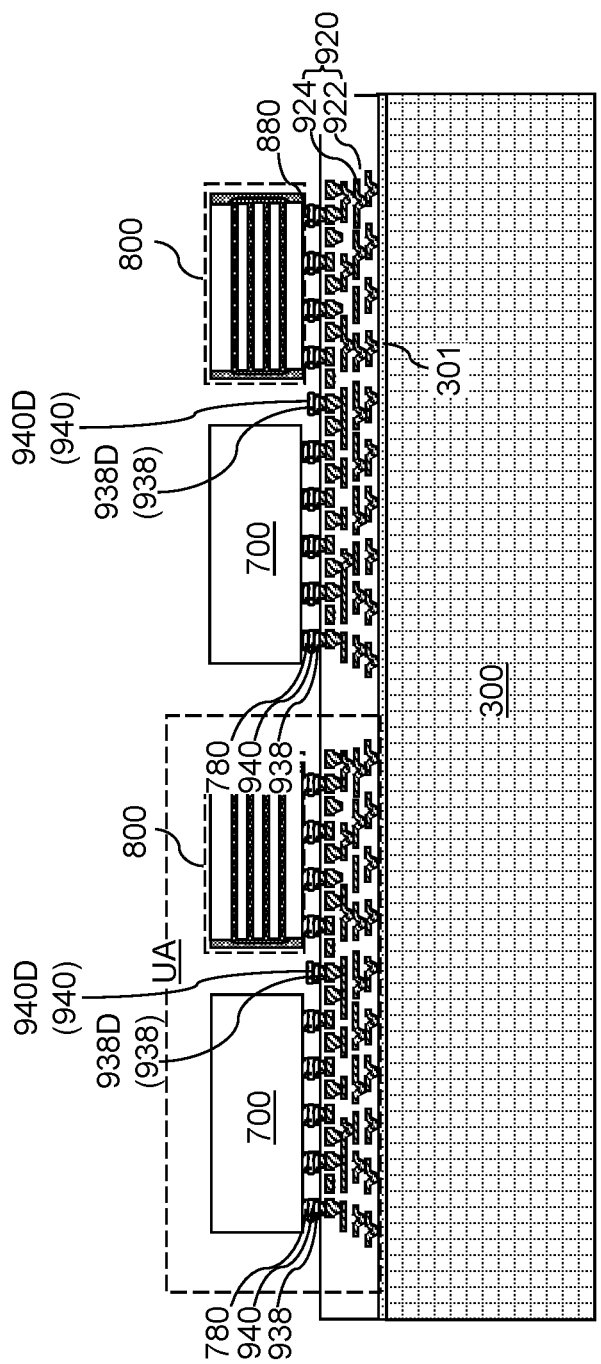
FIG. 3A is a vertical cross-sectional view of a region the exemplary structure after attaching semiconductor dies according to an embodiment of the present disclosure.
Figure 3B:
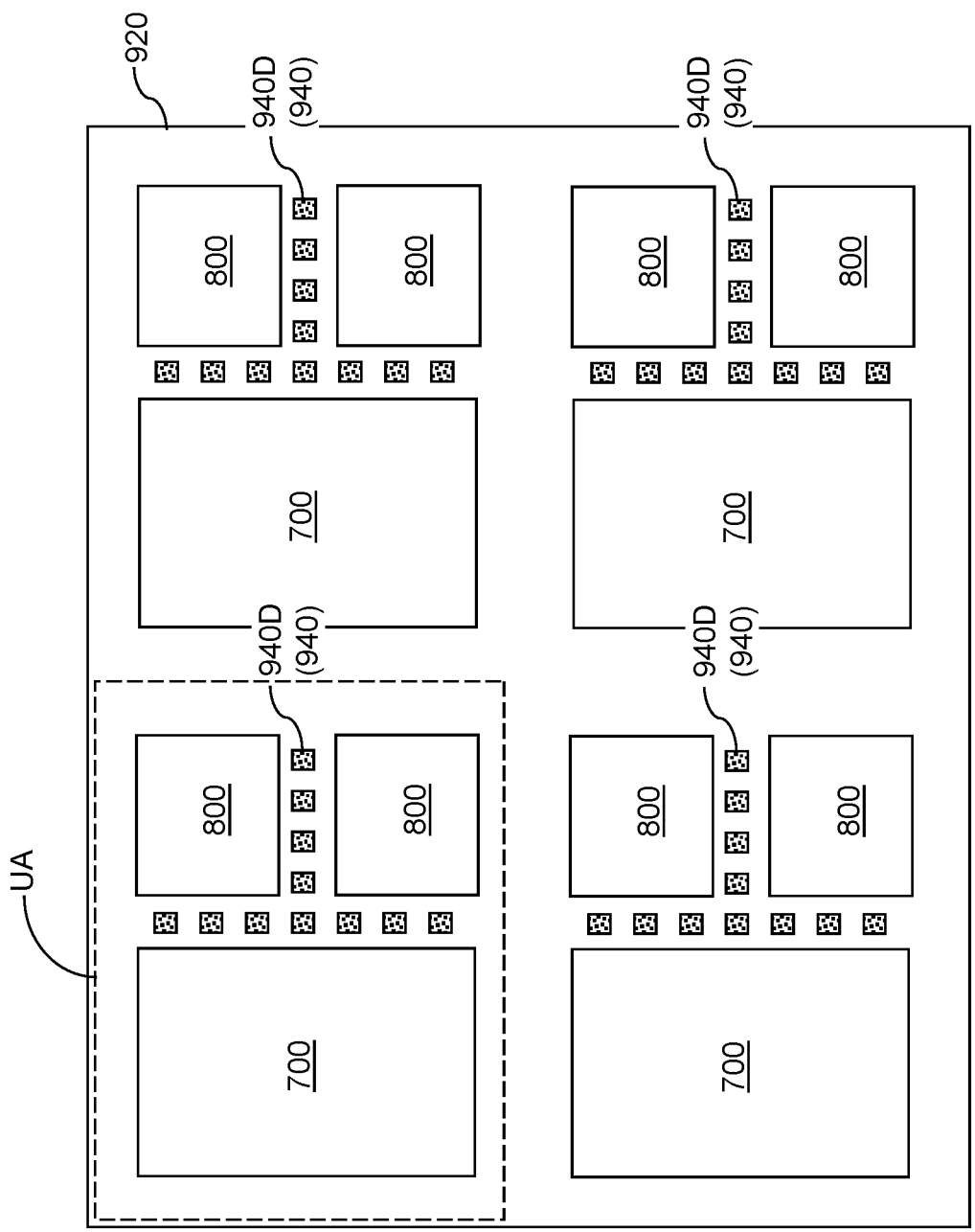
FIG. 3B is a top-down view of the region of the exemplary structure of FIG. 3A.

Referring to FIGS. 3A and 3B, a set of at least one semiconductor die (700, 800) may be bonded to each redistribution structure 920. In one embodiment, the redistribution structures 920 may be arranged as a two-dimensional periodic array, and multiple sets of at least one semiconductor die (700, 800) may be bonded to the redistribution structures 920 as a two-dimensional periodic rectangular array of sets of the at least one semiconductor die (700, 800). Each set of at least one semiconductor die (700, 800) includes at least one semiconductor die. Each set of at least one semiconductor die (700, 800) may include any set of at least one semiconductor die known in the art. In one embodiment, each set of at least one semiconductor die (700, 800) may comprise a plurality of semiconductor dies (700, 800). For example, each set of at least one semiconductor die (700, 800) may include at least one system-on-chip (SoC) die 700 and/or at least one memory die 800. Each SoC die 700 may comprise an application processor die, a central processing unit die, or a graphic processing unit die. In one embodiment, the at least one memory die 800 may comprise a high bandwidth memory (HBM) die that includes a vertical stack of static random access memory dies. In one embodiment, the at least one semiconductor die (700, 800) may include at least one system-on-chip (SoC) die and a high bandwidth memory (HBM) die including a vertical stack of static random access memory (SRAM) dies that are interconnected to one another through microbumps and are laterally surrounded by an epoxy molding material enclosure frame.

Referring to FIGS. 3A and 3B, each of the semiconductor dies (700, 800) may include a respective array of die-side bonding structures (780, 880). For example, each SoC die 700 may include an array of SoC metal bonding structures 780, and each memory die 800 may include an array of memory-die metal bonding structures 880. Each of the semiconductor dies (700, 800) may be positioned in a face-down position such that die-side bonding structures (780, 880) face the first solder material portions 940. Each set of a plurality of semiconductor dies (700, 800) may be placed within a respective unit area UA. Placement of the semiconductor dies (700, 800) may be performed using a pick and place apparatus so that each of the die-side bonding structures (780, 880) is placed on a top surface of a respective one of the first solder material portions 940.

Generally, a redistribution structure 920 including redistribution-side bonding structures 938 thereupon may be provided, and a plurality of semiconductor dies (700, 800) including a respective set of die-side bonding structures (780, 880) may be provided. The plurality of semiconductor dies (700, 800) may be bonded to the redistribution structure 920 using first solder material portions 940 that are bonded to a respective redistribution-side bonding structure 938 within a first subset of the redistribution-side bonding structures 938 and to a respective one of the die-side bonding structures (780, 880). A second subset of the redistribution-side bonding structures 938 is not bonded to any of the plurality of semiconductor dies (700, 800).

The first subset of the redistribution-side bonding structures 938 may be bonded to a first subset of the first solder material portions 940, and the second subset of the redistribution-side bonding structures 938 may be bonded to a second subset of the first solder material portions 940. The second subset of the redistribution-side bonding structures 938 is herein referred to as dummy redistribution-side bonding structures 938D. The second subset of the first solder material portions 940 is herein referred to as dummy solder material portions 940D. The second subset of the redistribution-side bonding structures 938 (including the dummy redistribution-side bonding structure 938D) is devoid of any bonds to any of the die-side bonding structures (780, 880) of the plurality of semiconductor dies (700, 800). Put another way, the second subset of the redistribution-side bonding structures 938 (including the dummy redistribution-side bonding structure 938D) is not bonded to any of the die-side bonding structures (780, 880) of the plurality of semiconductor dies (700, 800).

Each redistribution-side bonding structure 938 within the first subset of the redistribution-side bonding structures 938 may have an areal overlap with a respective one of the plurality of semiconductor dies (700, 800) in a plan view (such as a top-down view), and may be located entirely within the area of the respective one of the plurality of semiconductor dies (700, 800) in the plan view. Each dummy redistribution-side bonding structure 938D does not have any areal overlap with the plurality of semiconductor dies (700, 800) in the plan view, and may be located entirely between areas of a neighboring pair of semiconductor dies (700, 800) within the plurality of semiconductor dies (700, 800) in the plan view.

Each first solder material portion 940 within the first subset of the first solder material portions 940 may have an areal overlap with a respective one of the plurality of semiconductor dies (700, 800) in the plan view, and may be located entirely within the area of the respective one of the plurality of semiconductor dies (700, 800) in the plan view. Each dummy solder material portion 940D does not have any areal overlap with the plurality of semiconductor dies (700, 800) in the plan view, and may be located entirely between areas of a neighboring pair of semiconductor dies (700, 800) within the plurality of semiconductor dies (700, 800) in the plan view.

Generally, first solder material portions 940 (such as the first subset of the first solder material portions 940) may be formed on the first subset of the redistribution-side bonding structures 938, and additional first solder material portions 940 (such as the dummy solder material portions 940D) may be formed on the second subset of the redistribution-side bonding structures 938 (i.e., on the dummy redistribution-side bonding structures 938D). The additional first solder material portions (such as the dummy solder material portions 940D) are not bonded to any of the die-side bonding structures (780, 880). The additional first solder material portions (such as the dummy solder material portions 940D) are devoid of any bonds to any of the die-side bonding structures (780, 880).

In one embodiment, the dummy solder material portions 940D may be located on a respective dummy redistribution-side bonding structure 938D selected from the second subset of the redistribution-side bonding structures 938, and do not contact any of the plurality of semiconductor dies (700, 800). In one embodiment, the dummy solder material portions 940D comprises at least one row of dummy solder material portions 940D arranged along a direction that is parallel to, and is located between, a pair of sidewalls of a neighboring pair of semiconductor dies (700, 800) selected from the plurality of semiconductor dies (700, 800). Each of the dummy solder material portions 940D has a same material composition as the sets of solder material portions 940 that are bonded to a respective pair of a redistribution-side bonding structure 938 and a die-side bonding structure (780, 880).

Generally, the dummy redistribution-side bonding structures 938D and the dummy solder material portions 940D do not have any areal overlap with the plurality of semiconductor dies (700, 800) in the plan view (such as the top-down view of FIG. 3B) within each unit area UA. In one embodiment, a row of dummy redistribution-side bonding structures 938D and a row of dummy solder material portions 940D may be located between areas of a neighboring pair of semiconductor dies (700, 800) within the plurality of semiconductor dies (700, 800) in the plan view. The arrangement of the dummy redistribution-side bonding structures 938D and the dummy solder material portions 940D may vary depending on the arrangement of the plurality of semiconductor dies (700, 800) within each unit area UA.

Figure 4A:
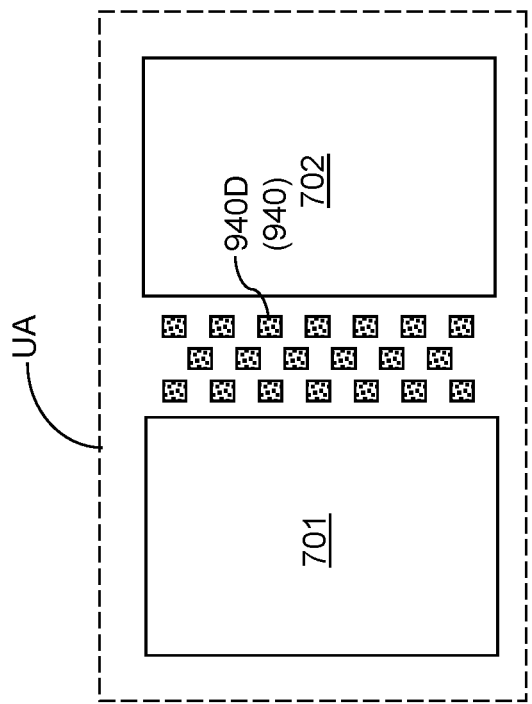
FIG. 4A is a top-down view of a region of a first alternative configuration of the exemplary structure after attaching semiconductor dies according to an embodiment of the present disclosure.
Figure 4B:
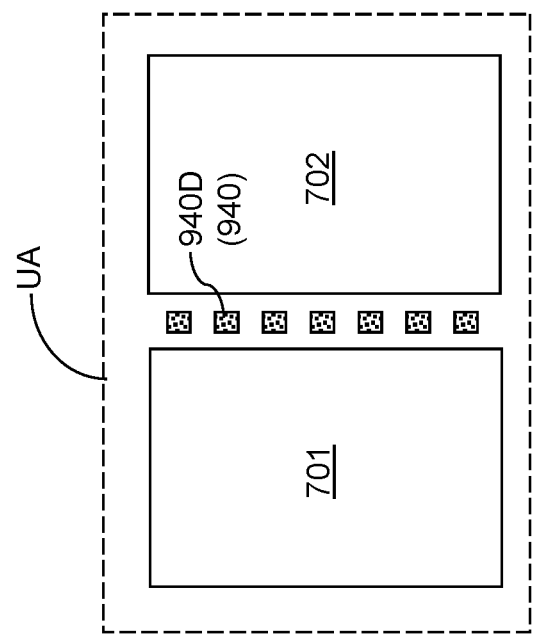
FIG. 4B is a top-down view of a region of a second alternative configuration of the exemplary structure after attaching semiconductor dies according to an embodiment of the present disclosure.
Figure 4C:
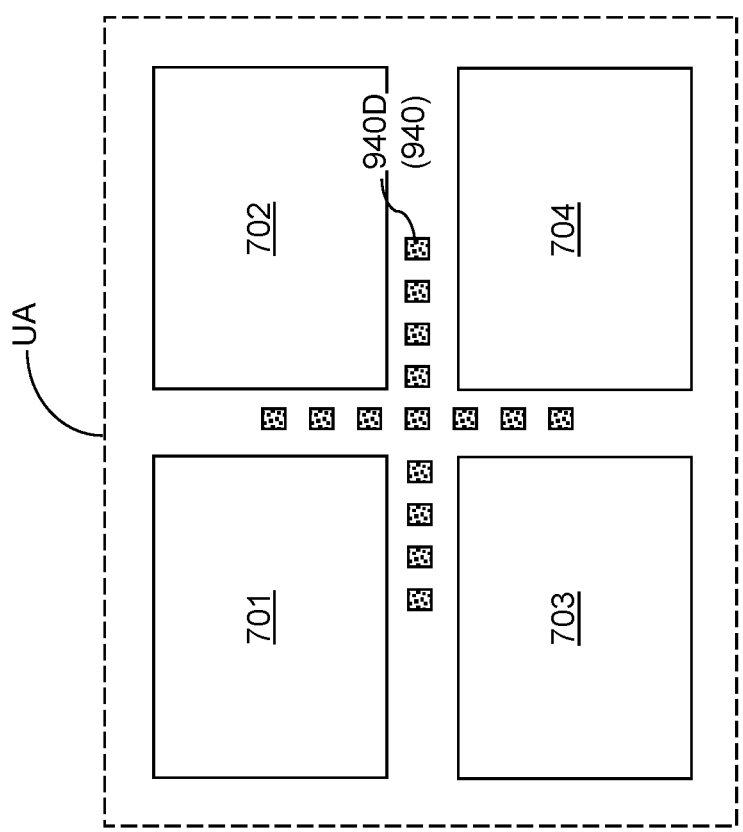
FIG. 4C is a top-down view of a region of a third alternative configuration of the exemplary structure after attaching semiconductor dies according to an embodiment of the present disclosure.

FIGS. 4A-4C illustrate alternative configurations of the exemplary structure that may be derived from the exemplary structure of FIGS. 3A and 3B by varying the arrangement of the semiconductor dies (700, 800) and/or the total number of semiconductor dies (700, 800) and/or the type(s) of the semiconductor dies (700, 800). The semiconductor dies (701, 702, 703, 704) within the alternative configurations of the exemplary structure in FIGS. 4A-4C include a first semiconductor die 701, a second semiconductor die 702, and optionally a third semiconductor die 703 and/or a fourth semiconductor die 704. Each of the semiconductor dies (701, 702, 703, 704) may comprise an SoC die 700 or a memory die 800. The pattern of the dummy redistribution-side bonding structures 938D and the dummy solder material portions 940D may include a single-row pattern illustrated in FIG. 4A, a multiple-row pattern illustrated in FIG. 4B, and/or a cross pattern illustrated in FIG. 4C. Generally, any pattern may be used for arrangement of the dummy redistribution-side bonding structures 938D and the dummy solder material portions 940D provided that at least one dummy redistribution-side bonding structure 938D and at least one dummy solder material portion 940D is placed between a neighboring pair of semiconductor dies {(700, 800) or (701, 702, 703, 704)}.

While FIGS. 3A, 3B, and 4A-4C illustrate configurations in which the dummy solder material portions 940D and the dummy redistribution-side bonding structures 938D have horizontal cross-sectional shapes of a respective rectangle. Generally, the dummy solder material portions 940D and the dummy redistribution-side bonding structures 938D may have a horizontal cross-sectional shape of any two-dimensional curvilinear shape having a closed periphery.

Referring to FIG. 5A, alternative shapes for the dummy solder material portions 940D (and for the dummy redistribution-side bonding structures 938) are shown, which may comprise a regular polygon having equal sides.

Referring to FIG. 5B, additional alternative shapes for the dummy solder material portions 940D (and for the dummy redistribution-side bonding structures 938) are shown, which may comprise an irregular polygon.

Yet alternatively, the dummy solder material portions 940D (and for the dummy redistribution-side bonding structures 938) may have horizontal cross-sectional shapes of a circle, an ellipse, an oval, or a curved two-dimensional shape having a closed periphery.

Figure 6:
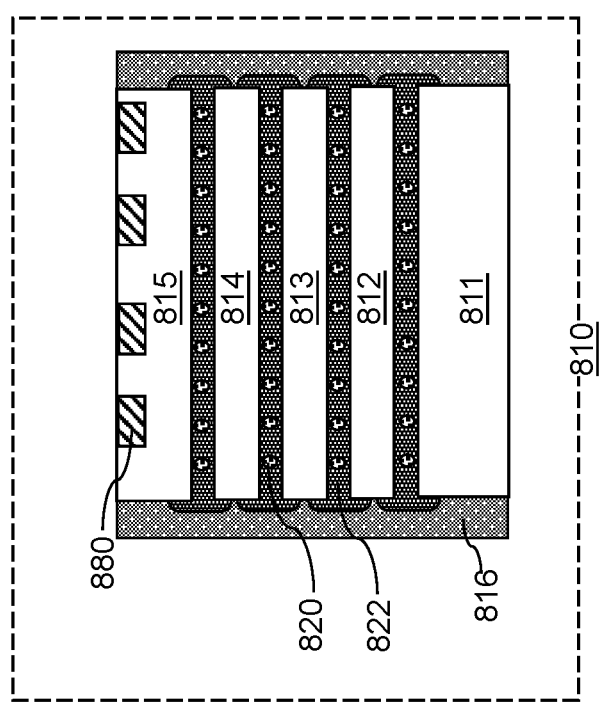
FIG. 6 is a magnified vertical cross-sectional view of a high bandwidth memory die.

Referring to FIG. 6, a high bandwidth memory (HBM) die 810 is illustrated, which may be used as a memory die 800 within the exemplary structures of FIGS. 3A and 3B, 4A, 4B, and/or 4C. The HBM die 810 includes a vertical stack of static random access memory dies (811, 812, 813, 814, 815) that are interconnected to one another through microbumps 820 and are laterally surrounded by an epoxy molding material enclosure frame 816. The gaps between vertically neighboring pairs of the random access memory dies (811, 812, 813, 814, 815) may be filled with a HBM underfill material portions 822 that laterally surrounds a respective set of microbumps 820. The HBM die 810 may comprise an array of memory-die metal bonding structures 880 configured to be bonded to a subset of an array of redistribution-side bonding structures 938 within a unit area UA. The HBM die 810 may be configured to provide a high bandwidth as defined under JEDEC standards, i.e., standards defined by The JEDEC Solid State Technology Association.

Figure 7A:
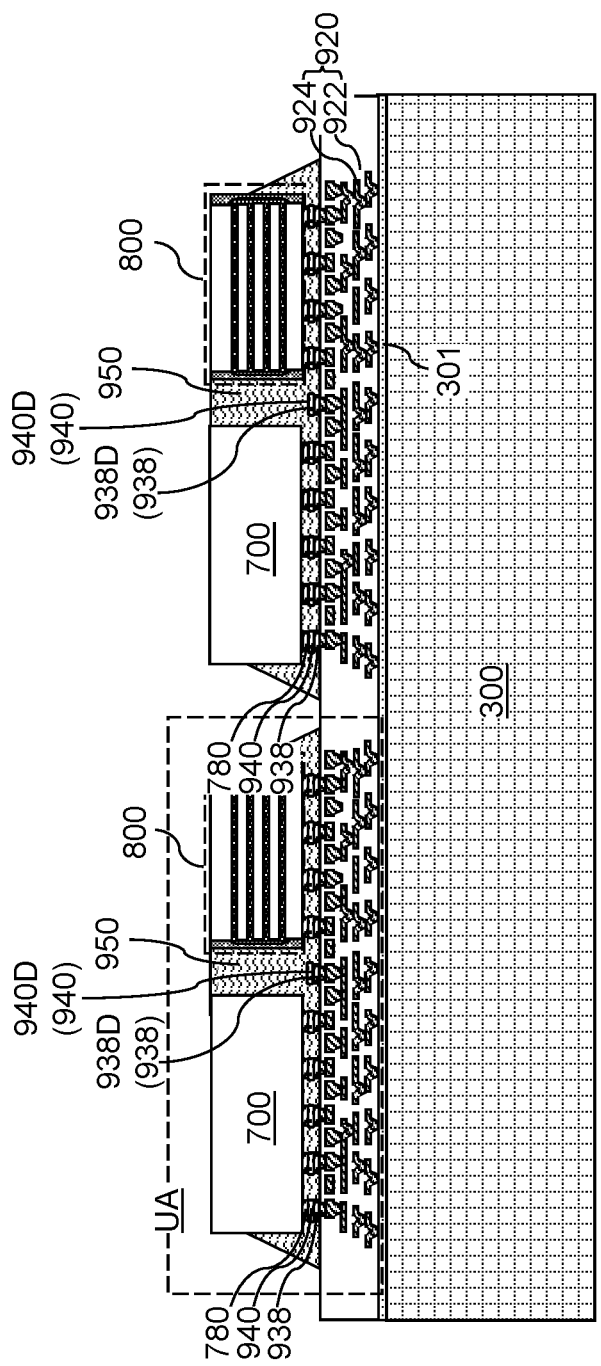
FIG. 7A is a vertical cross-sectional view of a region of the exemplary structure after formation of first underfill material portions according to an embodiment of the present disclosure.
Figure 7B:
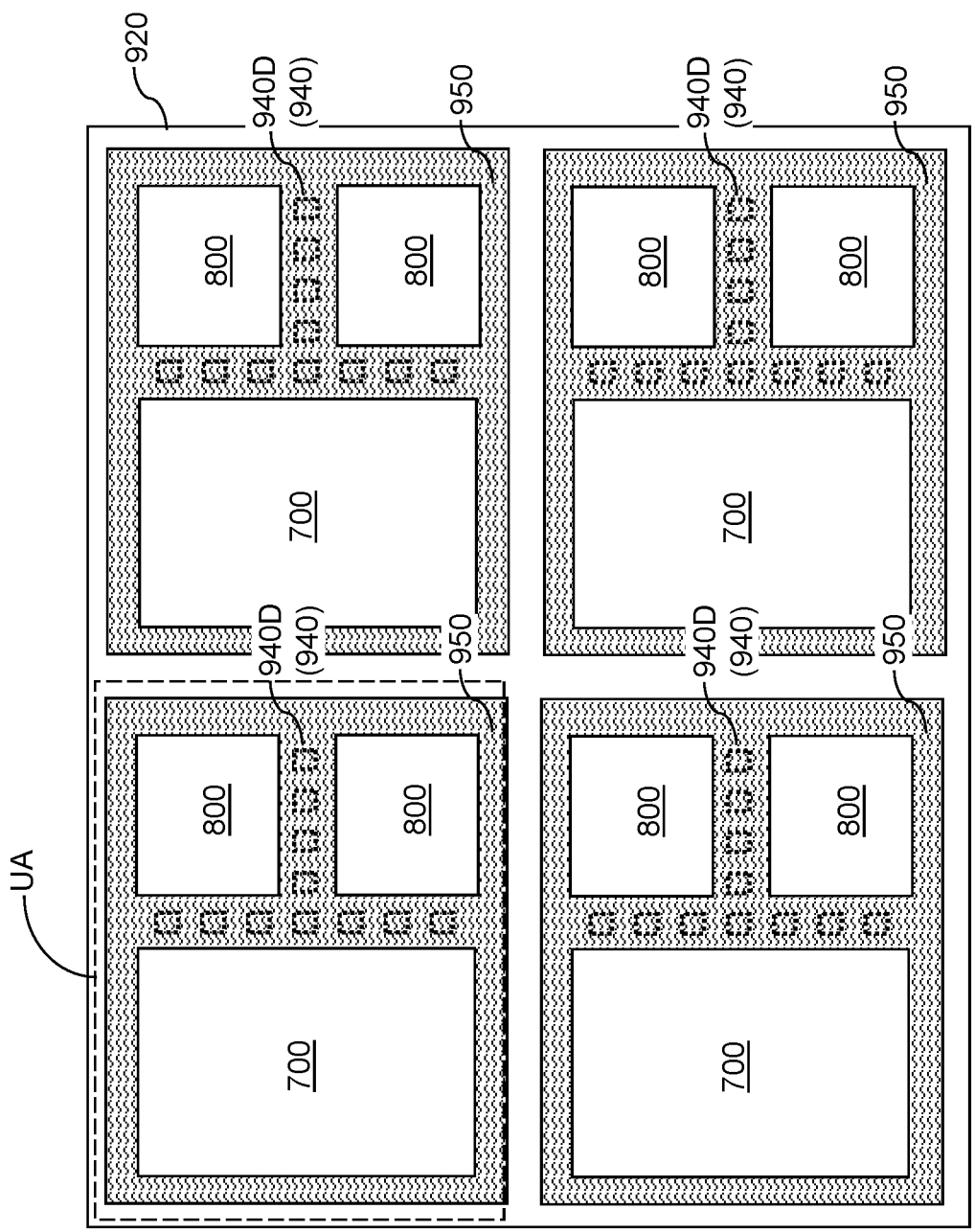
FIG. 7B is a top-down view of the region of the exemplary structure of FIG. 7A.

Referring to FIGS. 7A and 7B, a first underfill material may be applied into each gap between the redistribution structures 920 and sets of a plurality of semiconductor dies (700, 800) that are bonded to the redistribution structures 920. The first underfill material may comprise any underfill material known in the art. A first underfill material portion 950 may be formed within each unit area UA between a redistribution structure 920 and an overlying set of a plurality of semiconductor dies (700, 800). The first underfill material portions 950 may be formed by injecting the first underfill material around a respective array of first solder material portions 940 in a respective unit area UA. Any known underfill material application method may be used, which may be, for example, the capillary underfill method, the molded underfill method, or the printed underfill method.

Within each unit area UA, a first underfill material portion 950 laterally surrounds, and contacts, each of the first solder material portions 940 within the unit area UA, which include a first subset of the first solder material portions 940 that may be bonded to a respective pair of a redistribution-side bonding structure 938 and a die-side bonding structure (780 or 880), and a second subset of the first solder material portions 940 (i.e., the dummy solder material portions 940D) that are not bonded to any of the die-side bonding structures (780 or 880). The first underfill material portion 950 may be formed around, and may contact, the first solder material portions 940, the redistribution-side bonding structures 938, and the die-side bonding structures (780, 880) in the unit area UA. Within each unit area UA, the dummy redistribution-side bonding structures 938D (i.e., the subset of the redistribution-side bonding structures 938 that is not bonded (i.e., devoid of any bonds) to any of the die-side bonding structures (780, 880) of the plurality of semiconductor dies (700, 800), may be laterally surrounded by, and may contact, the first underfill material portion 950.

Each redistribution structure 920 in a unit area UA may include redistribution-side bonding structures 938. A plurality of semiconductor dies (700, 800) comprising a respective set of die-side bonding structures (780, 880) may be attached to a respective subset of the redistribution-side bonding structures 938 through a respective set of first solder material portions 940 (which include the first subset of the first solder material portions 940). Within each unit area UA, a first underfill material portion 950 laterally surrounds the redistribution-side bonding structures 938 and the die-side bonding structures (780, 880) of the plurality of semiconductor dies (700, 800). A subset of the redistribution-side bonding structures 938 (i.e., the dummy redistribution-side bonding structures 938D) is not bonded to any of the die-side bonding structures (780, 880) of the plurality of semiconductor dies (700, 800), and may be laterally surrounded by the first underfill material portion 950.

Figure 8A:
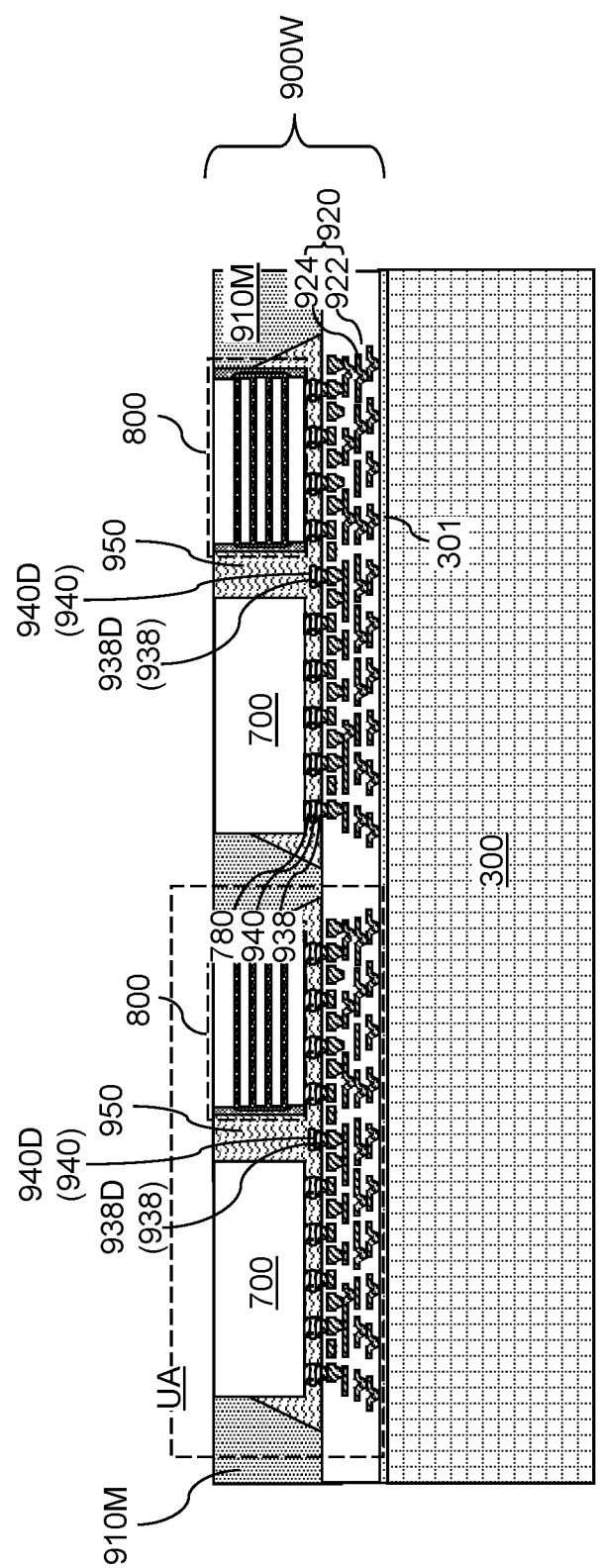
FIG. 8A is a vertical cross-sectional view of a region of the exemplary structure after formation of an epoxy molding compound (EMC) matrix according to an embodiment of the present disclosure.
Figure 8B:
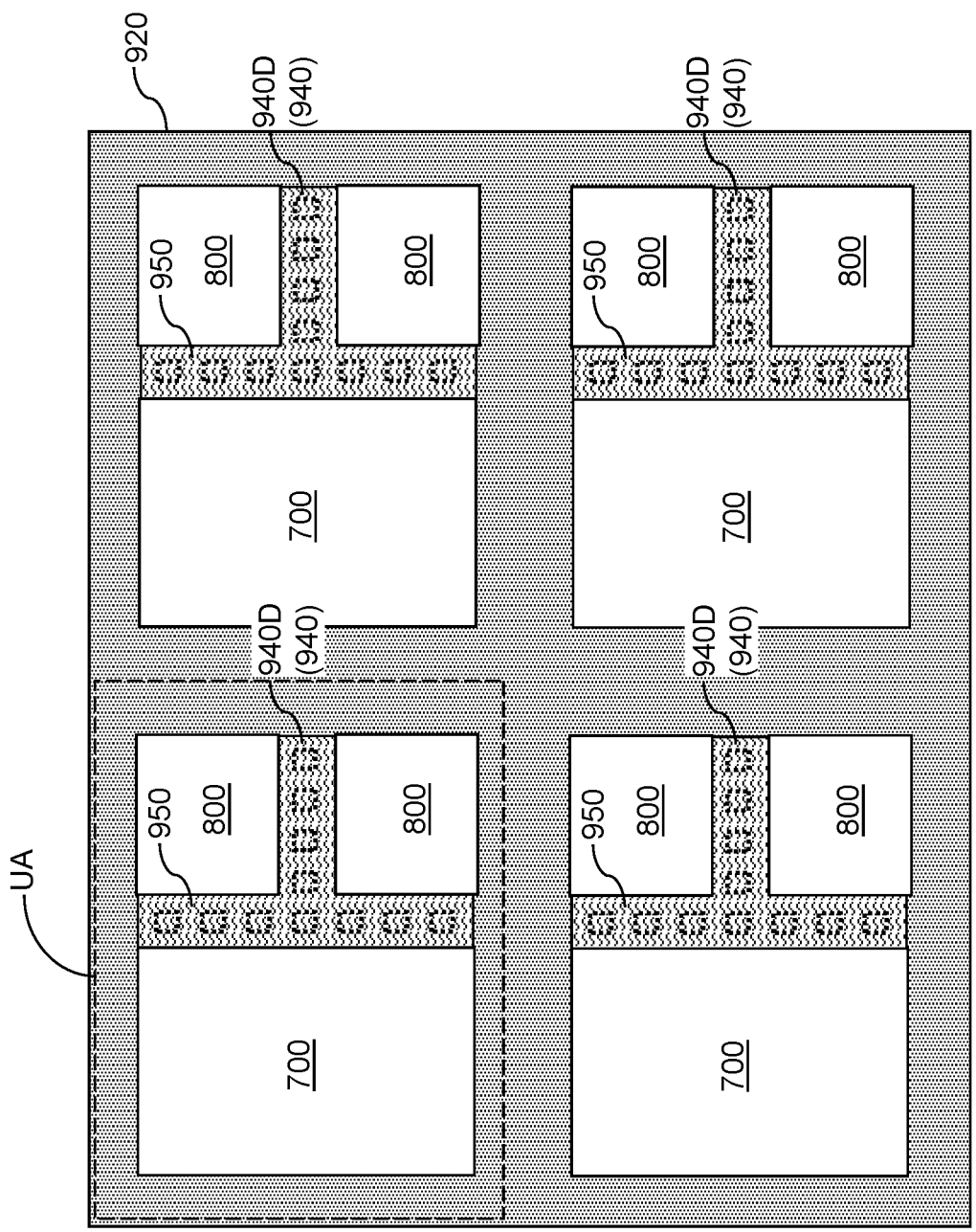
FIG. 8B is a top-down view of the region of the exemplary structure of FIG. 8A.

Referring to FIGS. 8A and 8B, an epoxy molding compound (EMC) may be applied to the gaps between contiguous assemblies of a respective set of semiconductor dies (700, 800) and a first underfill material portion 950. The EMC may include an epoxy-containing compound that may be hardened (i.e., cured) to provide a dielectric material portion having sufficient stiffness and mechanical strength. The EMC may include epoxy resin, hardener, silica (as a filler material), and other additives. The EMC may be provided in a liquid form or in a solid form depending on the viscosity and flowability. Liquid EMC provides better handling, good flowability, less voids, better fill, and less flow marks. Solid EMC provides less cure shrinkage, better stand-off, and less die drift. A high filler content (such as 85% in weight) within an EMC may shorten the time in mold, lower the mold shrinkage, and reduce the mold warpage. Uniform filler size distribution in the EMC may reduce flow marks, and may enhance flow ability. The curing temperature of the EMC may be lower than the release (debonding) temperature of the first adhesive layer 301 if the adhesive layer includes a thermally debonding material. For example, the curing temperature of the EMC may be in a range from 125° C. to 150° C.

The EMC may be cured at a curing temperature to form an EMC matrix 910M that laterally surrounds and embeds each assembly of a set of semiconductor dies (700, 800) and a first underfill material portion 950. The EMC matrix 910M may include a plurality of epoxy molding compound (EMC) die frames that may be laterally adjoined to one another. Each EMC die frame may be a portion of the EMC matrix 910M that is located within a respective unit area UA. Thus, each EMC die frame may laterally surround and embed a respective a set of semiconductor dies (700, 800) and a respective first underfill material portion 950.

Portions of the EMC matrix 910M that overlies the horizontal plane including the top surfaces of the semiconductor dies (700, 800) may be removed by a planarization process. For example, the portions of the EMC matrix 910M that overlies the horizontal plane may be removed using a chemical mechanical planarization. The combination of the remaining portion of the EMC matrix 910M, the semiconductor dies (700, 800), the first underfill material portions 950, and the two-dimensional array of redistribution structures 920 comprises a reconstituted wafer 900W. Each portion of the EMC matrix 910M located within a unit area UA constitutes an EMC die frame.

Figure 9:
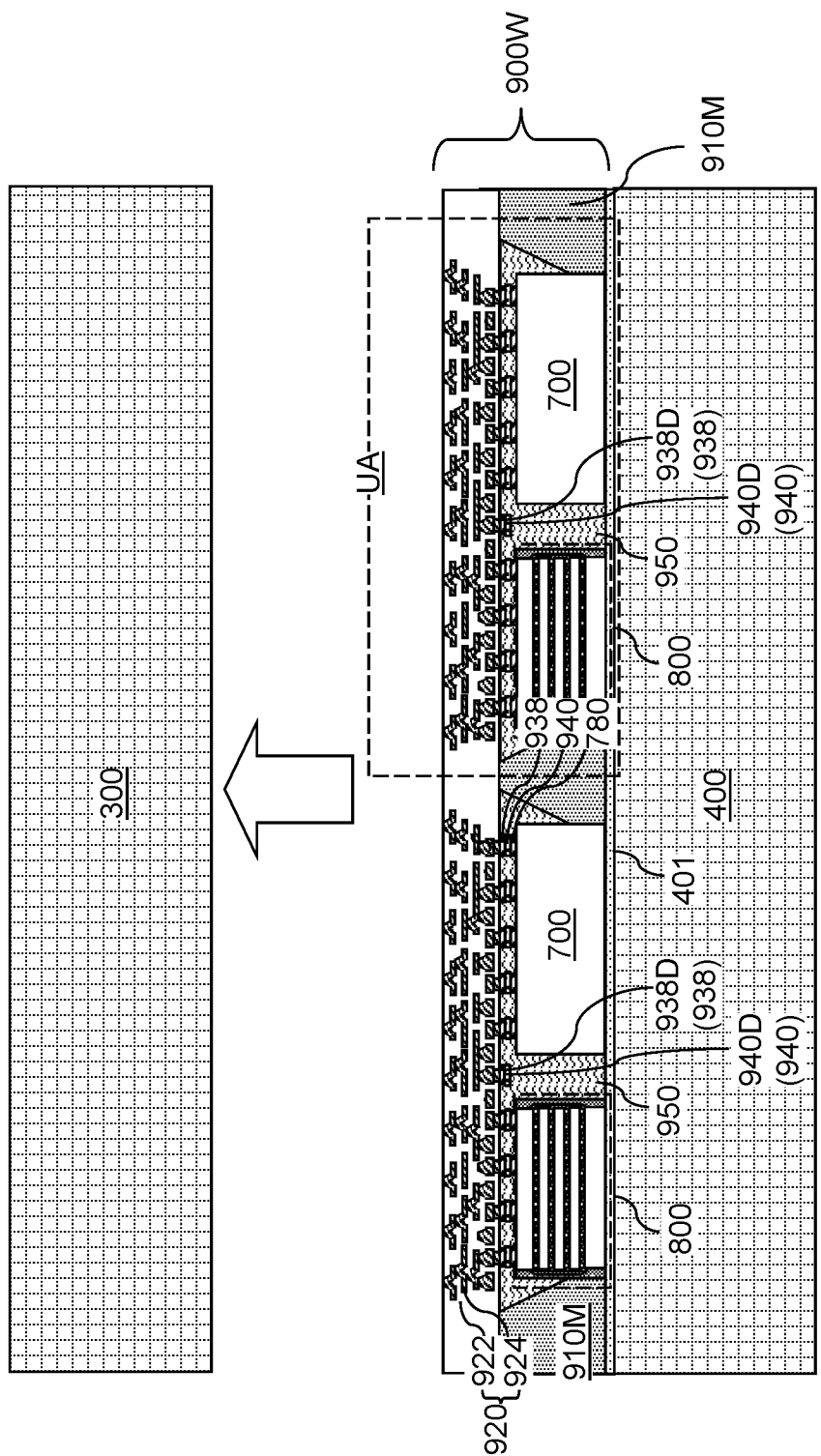
FIG. 9 is a vertical cross-sectional view of a region of the exemplary structure after attaching a second carrier substrate and detaching the first carrier substrate according to an embodiment of the present disclosure.

Referring to FIG. 9, a second adhesive layer 401 may be applied to the physically exposed planar surface of the reconstituted wafer 900W, i.e., the physically exposed surfaces of the EMC matrix 910M, the semiconductor dies (700, 800), and the first underfill material portions 950. In one embodiment, the second adhesive layer 401 may comprise a same material as, or may comprise a different material from, the material of the first adhesive layer 301. If the first adhesive layer 301 comprises a thermally decomposing adhesive material, the second adhesive layer 401 comprises another thermally decomposing adhesive material that decomposes at a higher temperature, or may comprise a light-to-heat conversion material.

A second carrier substrate 400 may be attached to the second adhesive layer 401. The second carrier substrate 400 may be attached to the opposite side of the reconstituted wafer 900W relative to the first carrier substrate 300. Generally, the second carrier substrate 400 may comprise any material that may be used for the first carrier substrate 300. The thickness of the second carrier substrate 400 may be in a range from 500 microns to 2,000 microns, although lesser and greater thicknesses may also be used.

The first adhesive layer 301 may be decomposed by ultraviolet radiation or by a thermal anneal at a debonding temperature. In embodiments in which the first carrier substrate 300 includes an optically transparent material and the first adhesive layer 301 includes an LTHC layer, the first adhesive layer 301 may be decomposed by irradiating ultraviolet light through the transparent carrier substrate. The LTHC layer may be absorb the ultraviolet radiation and generate heat, which decomposes the material of the LTHC layer and cause the transparent first carrier substrate 300 to be detached from the reconstituted wafer 900W. In embodiments in which the first adhesive layer 301 includes a thermally decomposing adhesive material, a thermal anneal process at a debonding temperature may be performed to detach the first carrier substrate 300 from the reconstituted wafer 900W.

Figure 10:
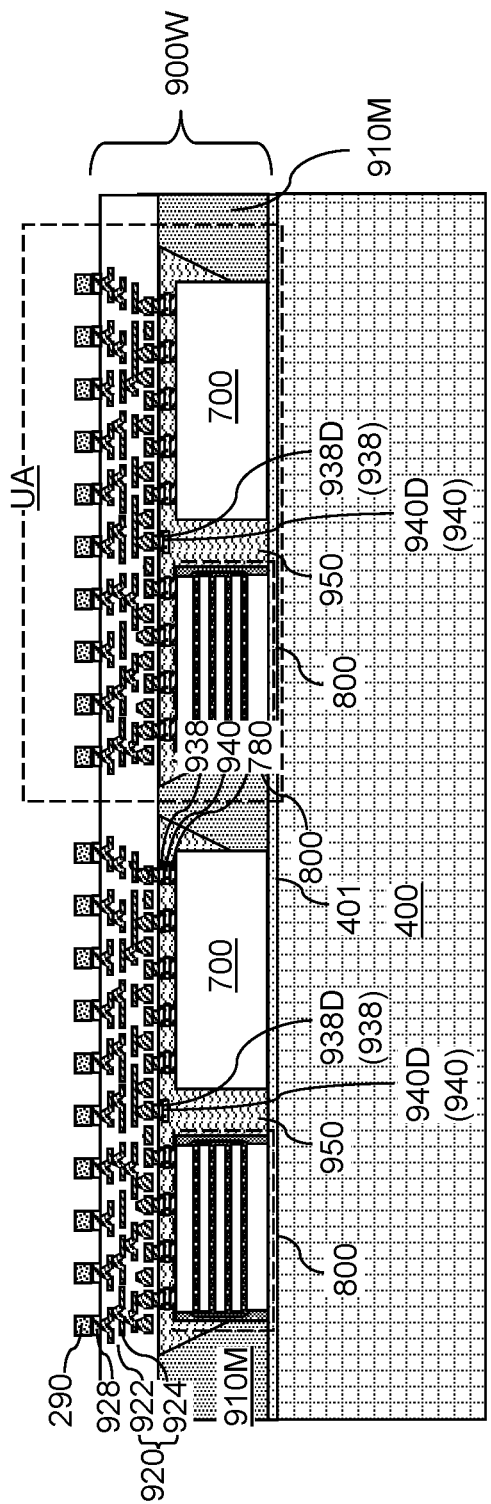
FIG. 10 is a vertical cross-sectional view of a region of the exemplary structure after formation of fan-out bonding pads according to an embodiment of the present disclosure.

Referring to FIG. 10, fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 25 microns, and having a pitch in a range from 20 microns to 50 microns. In some embodiments, the second solder material portions 290 may be, or include, copper pillars.

The fan-out bonding pads 928 and the second solder material portions 290 may be formed on the opposite side of the EMC matrix 910M and the two-dimensional array of sets of semiconductor dies (700, 800) relative to the redistribution structure layer. The redistribution structure layer includes a three-dimensional array of redistribution structures 920. Each redistribution structure 920 may be located within a respective unit area UA. Each redistribution structure 920 may comprise redistribution dielectric layers 922, redistribution wiring interconnects 924 embedded in the redistribution dielectric layers 922, and fan-out bonding pads 928. The fan-out bonding pads 928 may be located on an opposite side of the redistribution-side bonding structures 938 relative to the redistribution dielectric layers 922, and may be electrically connected to a respective one of the redistribution-side bonding structures 938.

Figure 11:
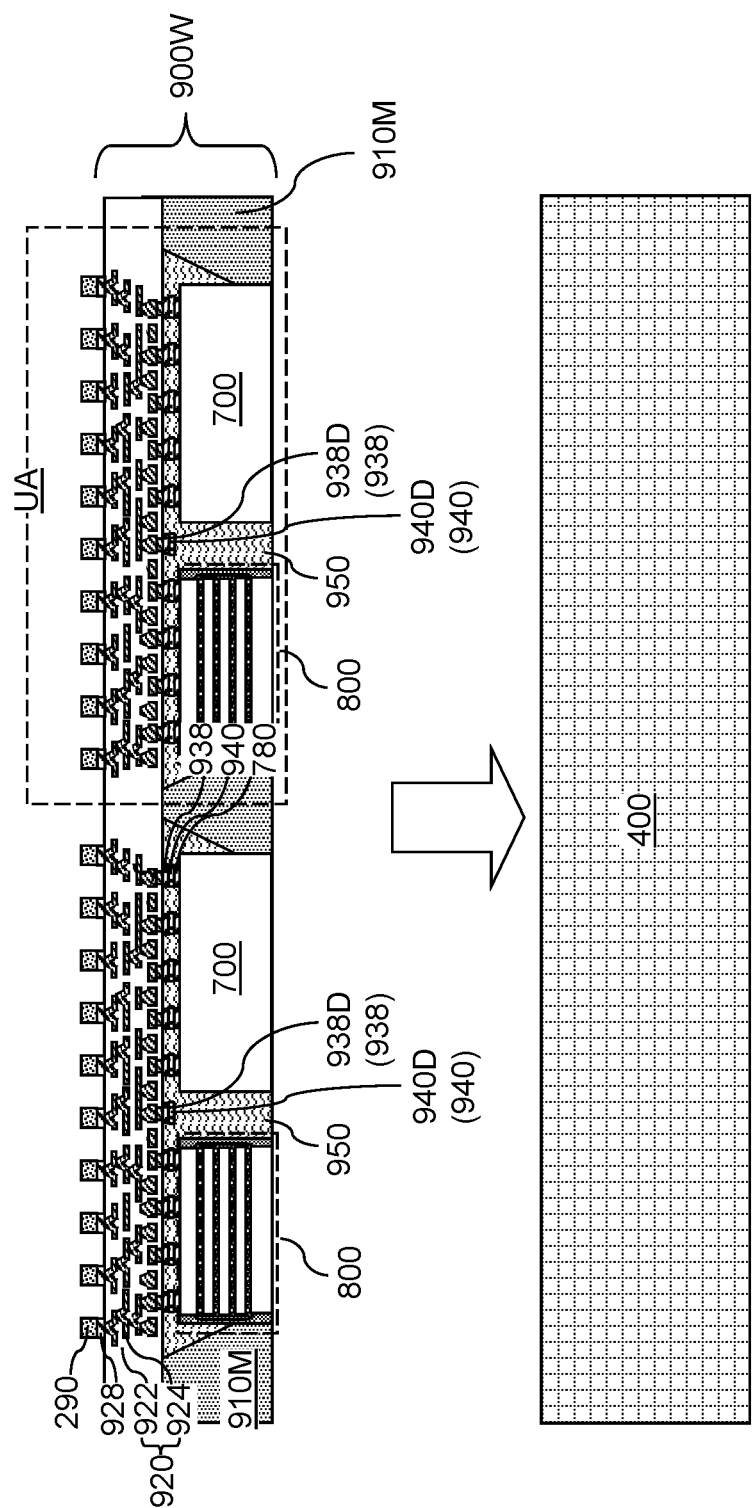
FIG. 11 is a vertical cross-sectional view of a region of the exemplary structure after detaching the second carrier substrate according to an embodiment of the present disclosure.

Referring to FIG. 11, the second adhesive layer 401 may be decomposed by ultraviolet radiation or by a thermal anneal at a debonding temperature. In embodiments in which the second carrier substrate 400 includes an optically transparent material and the second adhesive layer 401 includes an LTHC layer, the second adhesive layer 401 may be decomposed by irradiating ultraviolet light through the transparent carrier substrate. In embodiments in which the second adhesive layer 401 includes a thermally decomposing adhesive material, a thermal anneal process at a debonding temperature may be performed to detach the second carrier substrate 400 from the reconstituted wafer 900W.

Figure 12:
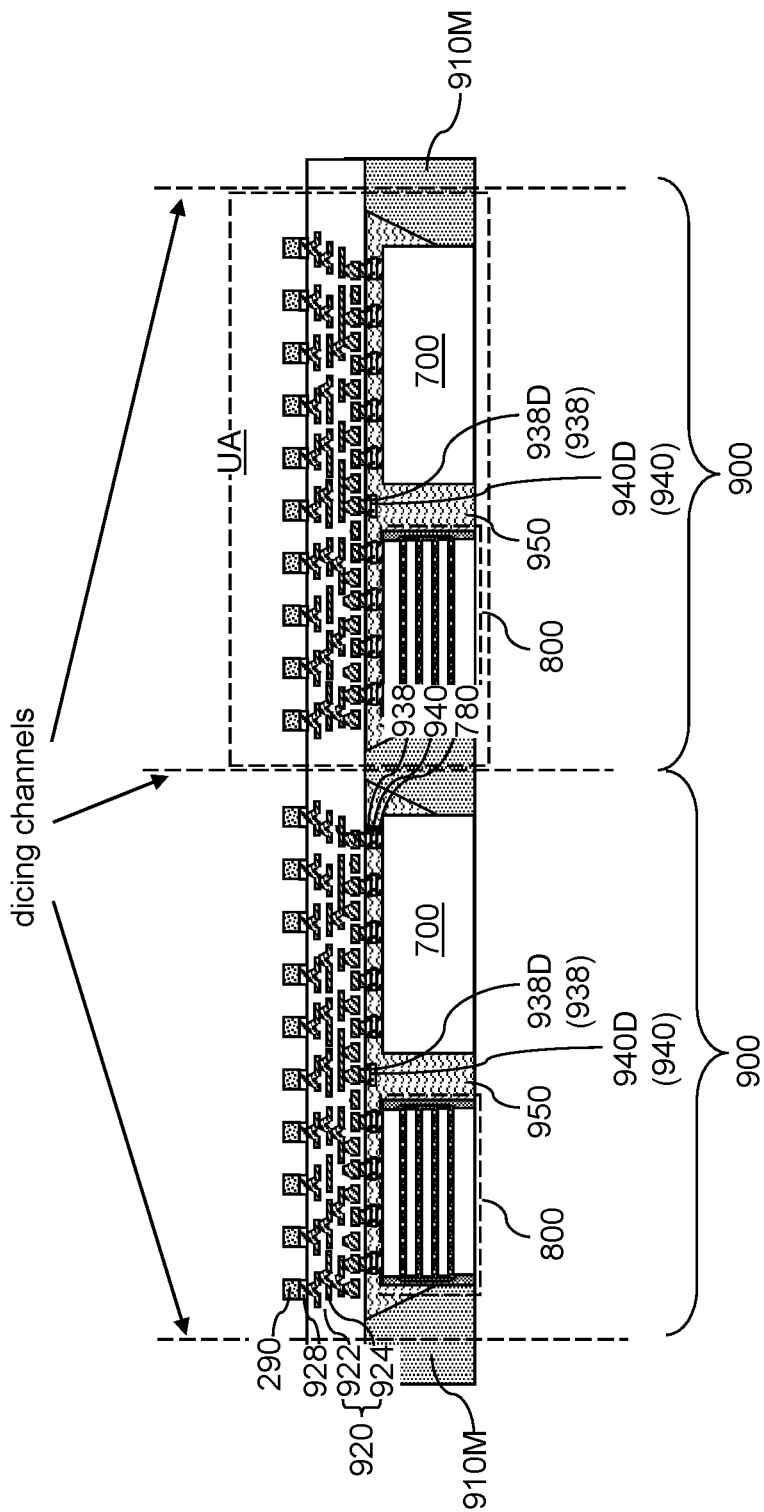
FIG. 12 is a vertical cross-sectional view of a region of the exemplary structure during dicing of a reconstituted wafer and the EMC matrix according to an embodiment of the present disclosure.

Referring to FIG. 12, the reconstituted wafer 900W including the fan-out bonding pads 928 may be subsequently diced along dicing channels by performing a dicing process. The dicing channels correspond to the boundaries between neighboring pairs of unit areas UA. Each diced unit from the reconstituted wafer 900W comprises a fan-out package 900. In other words, each diced portion of the assembly of the two-dimensional array of sets of semiconductor dies (700, 800), the two-dimensional array of first underfill material portions 950, the EMC matrix 910M, and the two-dimensional array of redistribution structures 920 constitutes a fan-out package 900. Each diced portion of the EMC matrix 910M constitutes a molding compound die frame 910. Each diced portion of the redistribution structure layer (which includes the two-dimensional array of redistribution structures 920) constitutes a redistribution structure 920.

Figure 13:
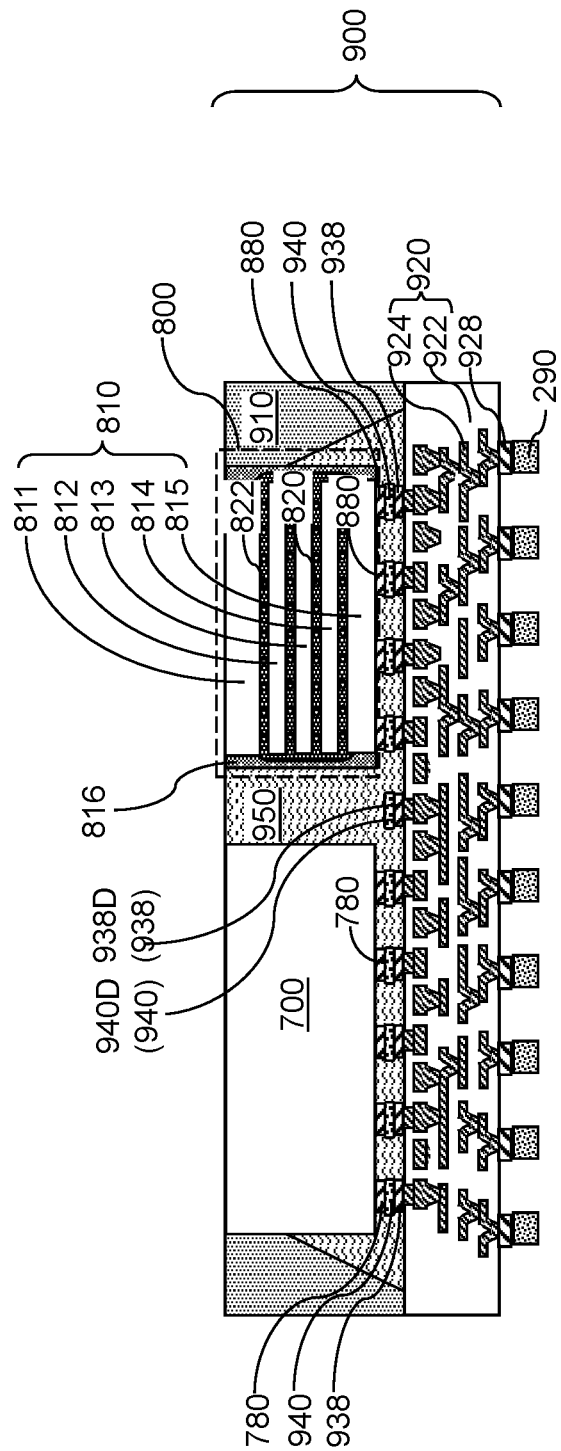
FIG. 13 is a vertical cross-sectional view of a fan-out package according to an embodiment of the present disclosure.

Referring to FIG. 13, a fan-out package 900 obtained by dicing the exemplary structure at the processing steps of FIG. 12 is illustrated. The fan-out package 900 comprises a redistribution structure 920 including redistribution-side bonding structures 938, a plurality of semiconductor dies (700, 800) comprising a respective set of die-side bonding structures (780, 880) that is attached to a respective subset of the redistribution-side bonding structures 938 through a respective set of first solder material portions 940, a first underfill material portion 950 laterally surrounding the redistribution-side bonding structures 938 and the die-side bonding structures (780, 880) of the plurality of semiconductor dies (700, 800), wherein a subset of the redistribution-side bonding structures 938 is located between a neighboring pair of semiconductor dies (700, 800) selected from the plurality of semiconductor dies (700, 800) in a plan view, i.e., a view along a direction that is perpendicular to an interface between the redistribution structure 920 and the first underfill material portion 950. The fan-out package 900 may comprise a molding compound die frame 910 laterally surrounding the plurality of semiconductor dies (700, 800) and comprising a molding compound material. In one embodiment, the molding compound die frame 910 may include sidewalls that are vertically coincident with sidewalls of the redistribution structure 920, i.e., located within same vertical planes as the sidewalls of the redistribution structure 920. Generally, the molding compound die frame 910 may be formed around the plurality of semiconductor dies (700, 800) after formation of the first underfill material portion 950 within each fan-out package 900. The molding compound material contacts a peripheral portion of a planar surface of the redistribution structure 920.

Figure 14:
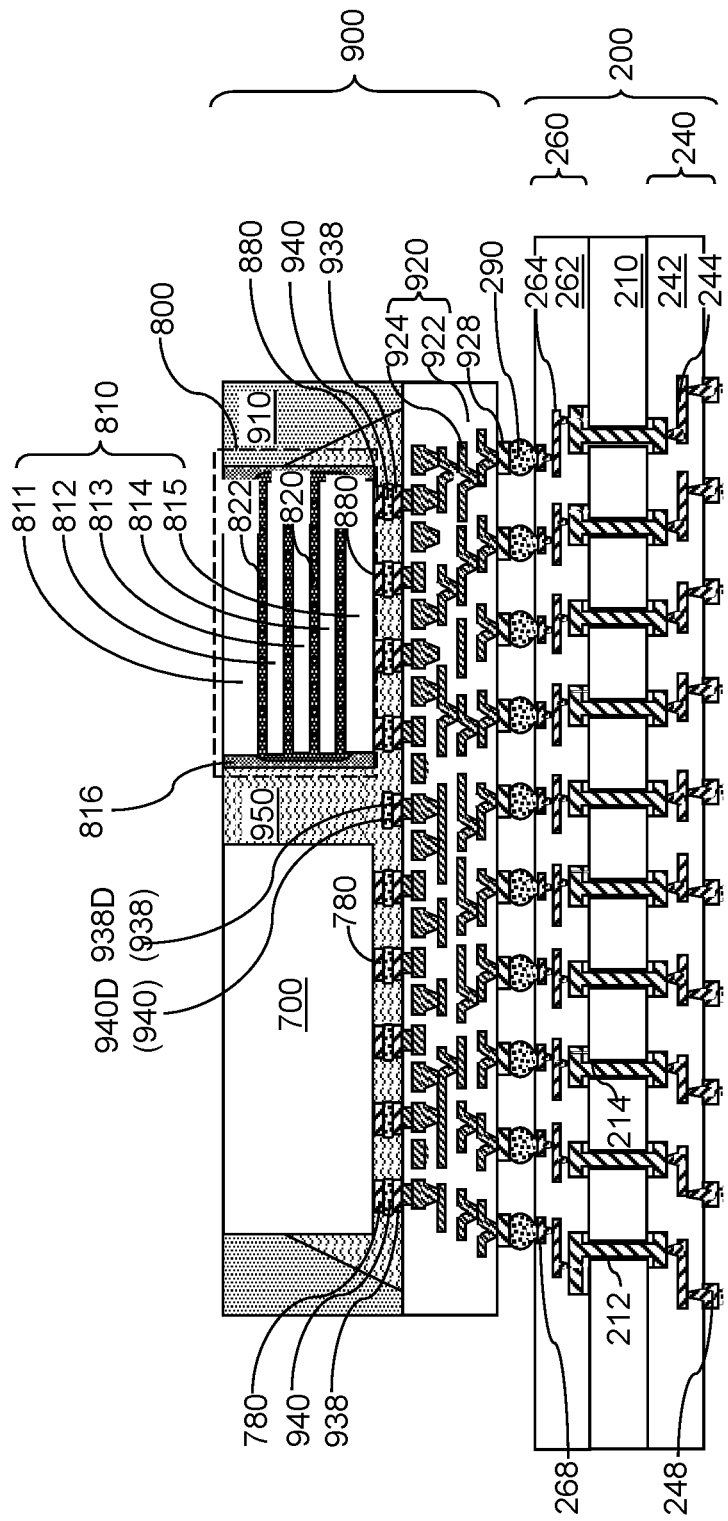
FIG. 14 is a vertical cross-sectional view of an exemplary structure after attaching the fan-out package to a package substrate according to an embodiment of the present disclosure.

Referring to FIG. 14, a package substrate 200 may be bonded to the fan-out package 900 through the second solder material portions 290. The package substrate 200 may be a cored package substrate including a core substrate 210, or a coreless package substrate that does not include a package core. Alternatively, the package substrate 200 may include a system-on-integrated package substrate (SoIS) including redistribution layers and/or dielectric interlayers, at least one embedded interposer (such as a silicon interposer). Such a system-integrated package substrate may include layer-to-layer interconnections using solder material portions, microbumps, underfill material portions (such as molded underfill material portions), and/or an adhesion film. While the present disclosure is described using an exemplary substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The package substrate 200 may include board-side surface laminar circuit (SLC) 240 and a chip-side surface laminar circuit (SLC) 260. The board-side SLC 240 may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the package substrate 200 includes a chip-side surface laminar circuit 260 comprising chip-side wiring interconnects 264 connected to an array of chip-side bonding pads 268 that is bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 is configured to allow bonding through C4 solder balls. Generally, any type of package substrate 200 may be used. While the present disclosure is described using an embodiment in which the package substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The second solder material portions 290 attached to the fan-out bonding pads 928 of the fan-out package 900 may be disposed on the array of the chip-side bonding pads 268 of the package substrate 200. A reflow process may be performed to reflow the second solder material portions 290, thereby inducing bonding between the fan-out package 900 and the package substrate 200. In one embodiment, the second solder material portions 290 may include C4 solder balls, and the fan-out package 900 may be attached to the package substrate 200 using an array of C4 solder balls.

Figure 15:
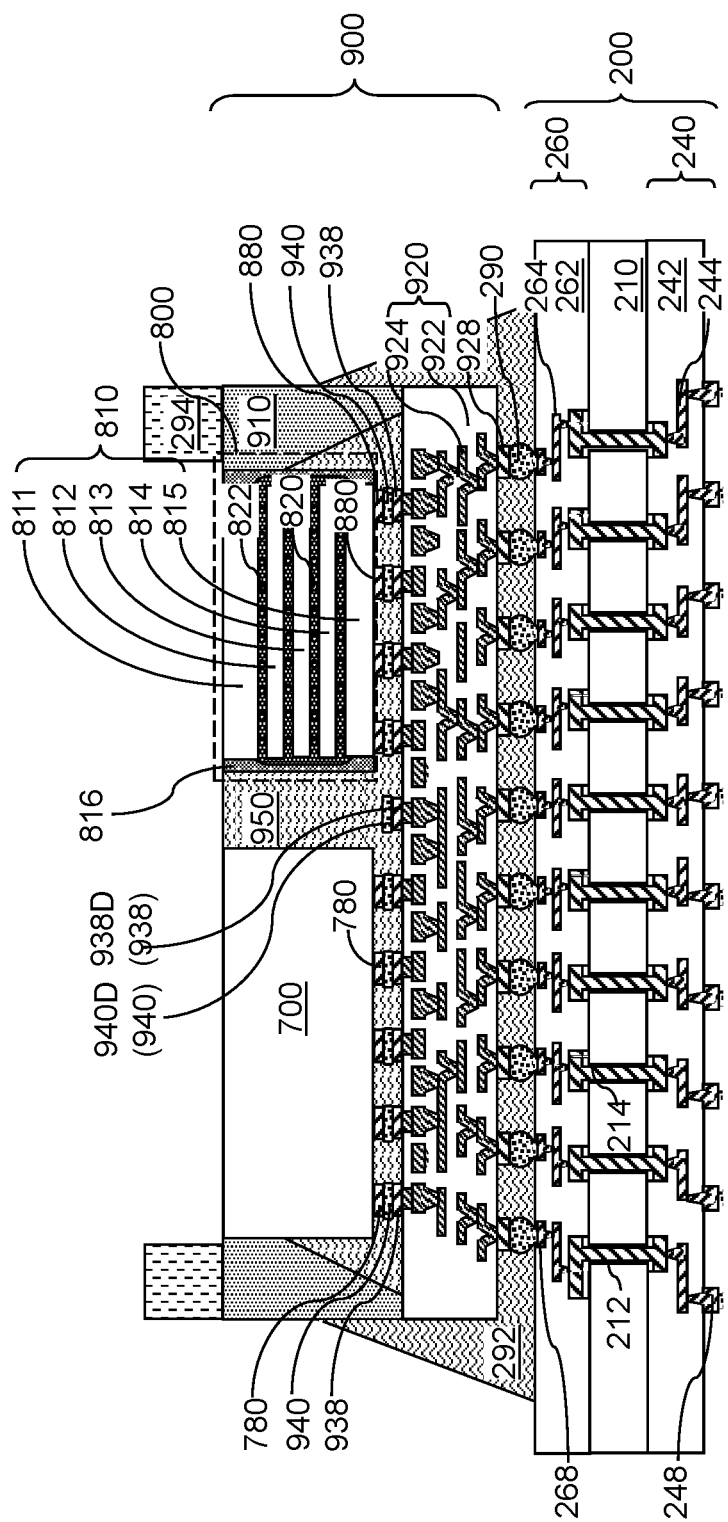
FIG. 15 is a vertical cross-sectional view of the exemplary structure after formation of a second underfill material portion according to an embodiment of the present disclosure.

Referring to FIG. 15, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method.

The second underfill material portion 292 may contact each of the second solder material portions 290 (which may be C4 solder balls or C2 solder caps), and may contact vertical sidewalls of the fan-out package 900. The second underfill material portion 292 is formed between the redistribution structure 920 and the package substrate 200. The second underfill material portion laterally surrounds, and contacts, the array of second solder material portions 290 and the fan-out package 900.

Optionally, a stabilization structure 294, such as a cap structure or a ring structure, may be attached to the assembly of the fan-out package 900 and the package substrate 200 to reduce deformation of the assembly during subsequent processing steps and/or during usage of the assembly.

Figure 16:
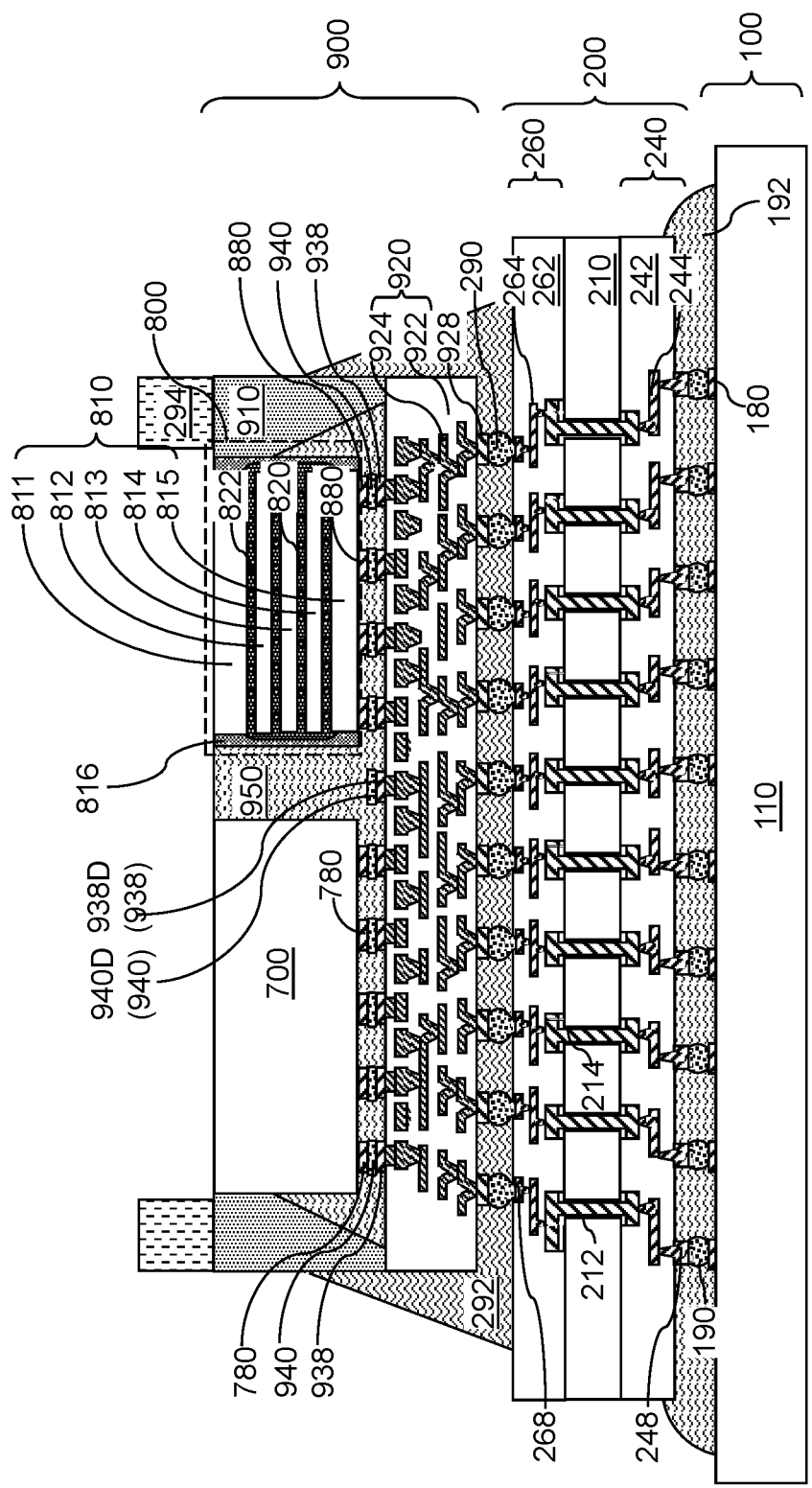
FIG. 16 is a vertical cross-sectional view of the exemplary structure after the package substrate is attached to a printed circuit board (PCB) according to an embodiment of the present disclosure.

Referring to FIG. 16, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. An underfill material portion 192 may be formed around the solder joints 190 by applying and shaping an underfill material. The package substrate 200 is attached to the PCB 100 through the array of solder joints 190.

Figure 17:
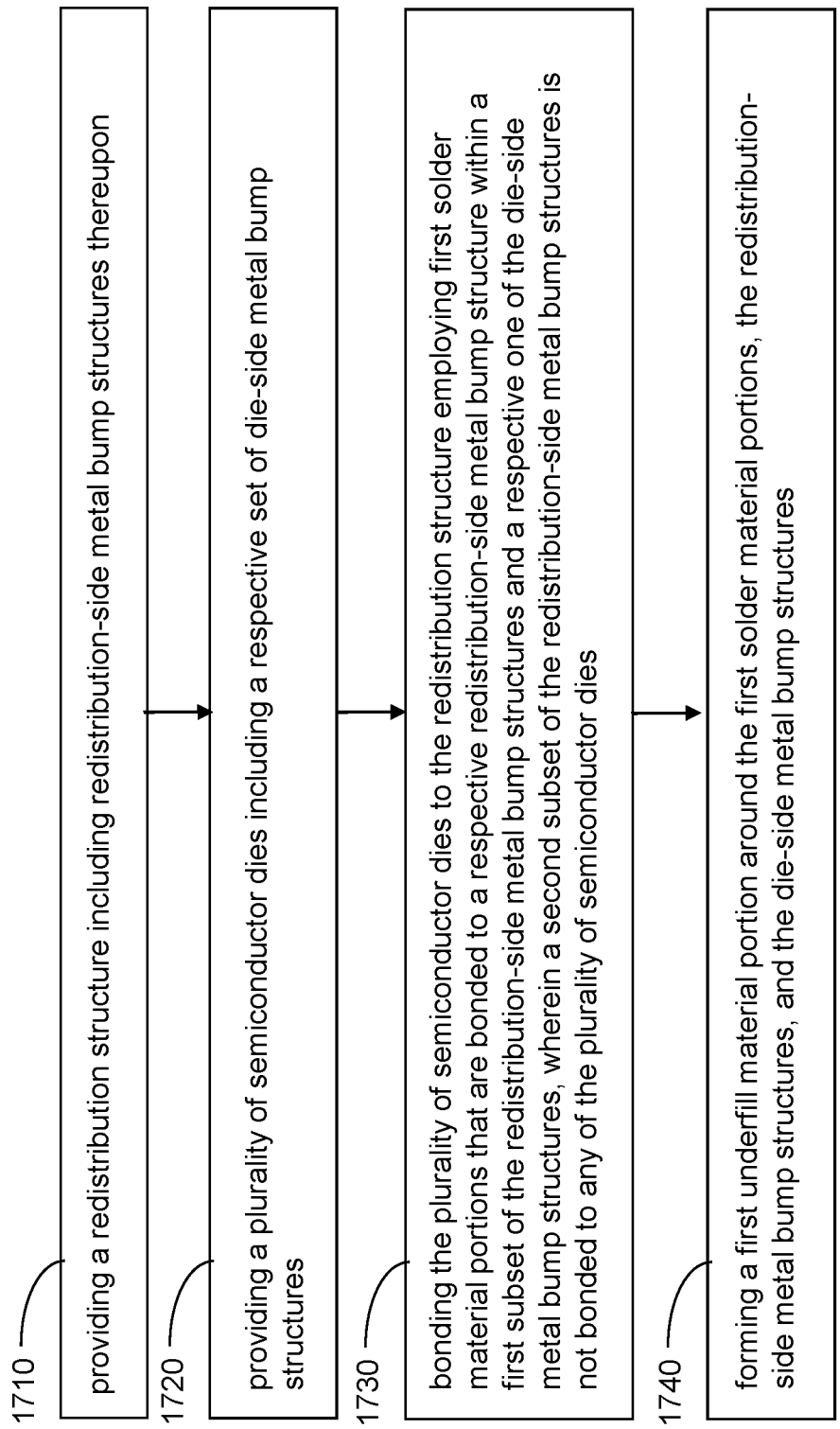
FIG. 17 is a flowchart illustrating steps for forming an exemplary structure according to an embodiment of the present disclosure.

Referring to FIG. 17, a flowchart illustrates steps for forming an exemplary structure according to an embodiment of the present disclosure.

Referring step 1710 and FIGS. 1, 2A, and 2B, a redistribution structure 920 including redistribution-side bonding structures 938 thereupon may be provided.

Referring to step 1720 and FIGS. 3A-6, a plurality of semiconductor dies (700, 800) including a respective set of die-side bonding structures (780, 880) may be provided.

Referring to step 1730 and FIGS. 3A-6, the plurality of semiconductor dies (700, 800) may be bonded to the redistribution structure 920 using first solder material portions 940 that are bonded to a respective redistribution-side bonding structure 938 within a first subset of the redistribution-side bonding structures 938 and to a respective one of the die-side bonding structures (780, 880). A second subset of the redistribution-side bonding structures 938 (such as the dummy redistribution-side bonding structures 938D) is not bonded to any of the plurality of semiconductor dies (700, 800).

Referring to step 1740 and FIGS. 7A and 7B, a first underfill material portion 950 may be formed around the first solder material portions 940, the redistribution-side bonding structures 938, and the die-side bonding structures (780, 880).

Referring to all drawings and according to various embodiments of the present disclosure, a fan-out package is provided, which comprises: a redistribution structure 920 comprising a plurality of first metal bonding structures (such as redistribution-side bonding structures 938) on a side; a plurality of semiconductor dies (700, 800) comprising a plurality of second metal bonding structures (such as the die-side bonding structures (780, 880)) that are attached to the first metal bonding structures 938 through bump portions (such as the first solder material portions 940); and an underfill material portion (such as the first underfill material portion 950) laterally surrounding the first metal bonding structures 938 and the second metal bonding structures (780, 880) of the plurality of semiconductor dies (700, 800), wherein a subset of the first metal bonding structures 938 comprises at least one dummy metal bonding structure 938D that is surrounded by the underfill material portion 950 and is electrically isolated from the semiconductor dies (700, 800) and the second metal bonding structures (780, 880) by the underfill material portion 950. Generally, the first metal bonding structures and the second metal bonding structures may comprise any type of bonding structures such as C4 bonding pads or C2 bonding pillars or any other type of metal structures to which a solder material can be bonded.

In one embodiment, at least one dummy metal bonding structure 938D is located between a neighboring pair of semiconductor dies (700, 800) selected from the plurality of semiconductor dies (700, 800) in a plan view. In one embodiment, the at least one dummy metal bonding structure 938D does not have an areal overlap with any of the plurality of semiconductor dies (700, 800) in the plan view.

In one embodiment, the fan-out package comprises at least one dummy bump portion (such as at least one dummy solder material portion 940D) located on a respective one of the at least one dummy metal bonding structure 938D and not contacting any of the second metal bonding structures (780, 880). In one embodiment, all surfaces of the at least one dummy bump portion 938D are in contact with the underfill material portion 950 or the at least one dummy metal bonding structure 938D.

In one embodiment, the at least one dummy bump portion 938D comprises at least one row of dummy bump portions 938D arranged along a direction that is parallel to, and is located between, a pair of sidewalls of a neighboring pair of semiconductor dies (700, 800) selected from the plurality of semiconductor dies (700, 800). In one embodiment, each of the at least one dummy bump portion 938D has a same material composition as the bump portions 938.

In one embodiment, the fan-out package 900 may include a molding compound die frame 910 laterally surrounding the plurality of semiconductor dies (700, 800) and comprising a molding compound material. In one embodiment, the molding compound die frame 910 may include sidewalls that are vertically coincident with sidewalls of the redistribution structure 920.

In one embodiment, the redistribution structure 920 may include: redistribution wiring interconnects 924 embedded in redistribution dielectric layers 922 and electrically connected to a respective one of the redistribution-side bonding structures 938; and fan-out bonding pads 928 located on an opposite side of the redistribution-side bonding structures 938 and electrically connected to a respective one of the redistribution-side bonding structures 938.

In one embodiment, the plurality of semiconductor dies (700, 800) at least one system-on-chip (SoC) die 700; and a memory die 800 such as a high bandwidth memory (HBM) die 810 including a vertical stack of static random access memory (SRAM) dies (811, 812, 813, 814, 815) that are interconnected to one another through microbumps 820 and may be laterally surrounded by an epoxy molding material enclosure frame 816.

According to an aspect of the present disclosure, a structure including a fan-out package 900 may be provided, which may include: a redistribution structure 920 may include redistribution-side bonding structures 938; a plurality of semiconductor dies (700, 800) which may include a respective set of die-side bonding structures (780, 880) that is attached to a respective subset of the redistribution-side bonding structures 938 through a respective set of solder material portions 940; and an underfill material portion 950 laterally surrounding the redistribution-side bonding structures 938 and the die-side bonding structures (780, 880) of the plurality of semiconductor dies (700, 800), wherein a subset of the redistribution-side bonding structures 938 (such as the dummy redistribution-side bonding structures 938D) is not bonded to any of the die-side bonding structures (780, 880) of the plurality of semiconductor dies (700, 800) and is laterally surrounded by the first underfill material portion 950.

In one embodiment, the subset of the redistribution-side bonding structures 938 (such as the dummy redistribution-side bonding structures 938D) is located between a neighboring pair of semiconductor dies (700, 800) selected from the plurality of semiconductor dies (700, 800) in a plan view. In one embodiment, the subset of the redistribution-side bonding structures 938 (such as the dummy redistribution-side bonding structures 938D) does not have an areal overlap with any of the plurality of semiconductor dies (700, 800) in the plan view.

In one embodiment, the fan-out package may include dummy solder material portions 940D located on a respective redistribution-side bonding structure 938 (such as a dummy redistribution-side bonding structure 938D) selected from the subset of the redistribution-side bonding structures 938. In some embodiments, the dummy solder material portions 940D and the dummy redistribution-side bonding structures 938D may not contact and/or be electrically connected to any of the plurality of semiconductor dies (700, 800).

In one embodiment, all surfaces of the dummy solder material portions 940D may be in contact with the first underfill material portion 950 or the subset of the redistribution-side bonding structures 938 (such as the dummy redistribution-side bonding structures 938D). In one embodiment, the dummy solder material portions 940D may include at least one row of dummy solder material portions 940D arranged along a direction that is parallel to, and may be located between, a pair of sidewalls of a neighboring pair of semiconductor dies (700, 800) selected from the plurality of semiconductor dies (700, 800). In one embodiment, each of the dummy solder material portions 940D may have a same material composition as the sets of solder material portions 940.

According to an aspect of the present disclosure, a chip package structure is provided, which may include: a fan-out package 900 including a redistribution structure 920 comprising redistribution-side bonding structures 938, a plurality of semiconductor dies (700, 800) may include a respective set of die-side bonding structures (780, 880) that may be attached to a respective subset of the redistribution-side bonding structures 938 through a respective set of first solder material portions 940, a first underfill material portion 950 laterally surrounding the redistribution-side bonding structures 938 and the die-side bonding structures (780, 880) of the plurality of semiconductor dies (700, 800), wherein a subset of the redistribution-side bonding structures 938 (such as the dummy redistribution-side bonding structures 938D) may be located between a neighboring pair of semiconductor dies (700, 800) selected from the plurality of semiconductor dies (700, 800) in a plan view; and a package substrate 200 that is attached to the fan-out package 900 via an array of second solder material portions 290.

In one embodiment, the chip package structure may include a molding compound die frame 910 laterally surrounding the plurality of semiconductor dies (700, 800) and may include a molding compound material that contacts a peripheral portion of a planar surface of the redistribution structure 920.

In one embodiment, the chip package structure may include a second underfill material portion 292 laterally surrounding the array of second solder material portions 290 and the fan-out package 900.

In one embodiment, the subset of the redistribution-side bonding structures 938 (such as the dummy redistribution-side bonding structures 938) is not bonded to any of the die-side bonding structures (780, 880) of the plurality of semiconductor dies (700, 800), and may be laterally surrounded by, and contacts, the first underfill material portion 950.

The various structures and methods of the present disclosure may be used to provide a chip package structure including a fan-out package 900 including dummy redistribution-side bonding structures 938D and dummy solder material portions 940D that modify the pattern of conduits for an underfill material and increases the capillary force for the underfill material. The various methods and structures of the present disclosure may be used to reduce or eliminate voids in the first underfill material portion 950 and to increase the reliability of the fan-out package 900.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
 a fan-out package including a redistribution structure comprising redistribution-side bonding structures, a plurality of semiconductor dies comprising a respective set of die-side bonding structures that is attached to a respective subset of the redistribution-side bonding structures through a respective set of first solder material portions, a first underfill material portion which comprises a horizontally-extending portion that laterally surrounds the redistribution-side bonding structures and the die-side bonding structures of the plurality of semiconductor dies and contacts each of the first solder material portions,
  wherein the plurality of semiconductor dies comprises a first semiconductor die having a first sidewall and a second semiconductor die having a second sidewall and disposed apart from the first semiconductor die in a plan view,
  wherein a gap region laterally bounded by four vertical planes connecting two vertically-extending edges of the first sidewall and two vertically-extending edges of the second sidewall is present between the first sidewall and the second sidewall,
  wherein the first underfill material portion further comprises a vertically-extending portion that is adjoined to the horizontally-extending portion, contacts the first sidewall and the second sidewall, fills an entirety of a volume of the gap region that is vertically bounded by a horizontal plane including top surfaces of the first semiconductor die and the second semiconductor die and by the horizontally-extending portion and laterally bounded by the four vertical planes,
  wherein a subset of the redistribution-side bonding structures is electrically isolated from the plurality of semiconductor dies and the die-side bonding structures by the underfill material portion and is located entirely within an area of the vertically-extending portion of the underfill material portion in the plan view; and
 a package substrate that is attached to the fan-out package via an array of second solder material portions.

2. The chip package structure of claim 1, further comprising a molding compound die frame laterally surrounding the plurality of semiconductor dies and comprising a molding compound material that contacts a peripheral portion of a planar surface of the redistribution structure.

3. The chip package structure of claim 2, further comprising a second underfill material portion laterally surrounding the array of second solder material portions and the fan-out package.

4. The chip package structure of claim 1, wherein the subset of the redistribution-side bonding structures is not bonded to any of the die-side bonding structures of the plurality of semiconductor dies, and is laterally surrounded by, and contacts, the first underfill material portion.

5. The chip package structure of claim 1, wherein the plurality of semiconductor dies comprises:
 at least one system-on-chip (SoC) die; and
 a high bandwidth memory (HBM) die including a vertical stack of static random access memory (SRAM) dies that are interconnected to one another through micro-solder materials and are laterally surrounded by an epoxy molding material enclosure frame.

6. A chip package structure, comprising:
 a fan-out package including a redistribution structure comprising a plurality of first metal bonding structures on a side, a plurality of semiconductor dies comprising a plurality of second metal bonding structures that are attached to the first metal bonding structures through an array of first solder material portions, and a first underfill material portion which comprises a horizontally-extending portion that laterally surrounds the first solder material portions,
  wherein the plurality of semiconductor dies comprises a first semiconductor die having a first sidewall and a second semiconductor die having a second sidewall and disposed apart from the first semiconductor die in a plan view,
  wherein a gap region laterally bounded by four vertical planes connecting two vertically-extending edges of the first sidewall and two vertically-extending edges of the second sidewall is present between the first sidewall and the second sidewall,
  wherein the first underfill material portion further comprises a vertically-extending portion that is adjoined to the horizontally-extending portion, contacts the first sidewall and the second sidewall, fills an entirety of a volume of the gap region that is vertically bounded by a horizontal plane including top surfaces of the first semiconductor die and the second semiconductor die and by the horizontally-extending portion and laterally bounded by the four vertical planes,
  wherein a subset of the first metal bonding structures comprises at least one dummy metal bonding structure that is surrounded by the first underfill material portion and is electrically isolated from the semiconductor dies and the second metal bonding structures by the first underfill material portion,
  wherein the at least one dummy metal bonding structure is located entirely within an area of the vertically-extending portion of the underfill material portion in the plan view; and
 a package substrate that is attached to the fan-out package via an array of second solder material portions.

7. The chip package structure of claim 6, wherein the at least one dummy metal bonding structure is located between a neighboring pair of semiconductor dies selected from the plurality of semiconductor dies in a plan view.

8. The chip package structure of claim 7, wherein the at least one dummy metal bonding structure does not have an areal overlap with any of the plurality of semiconductor dies in the plan view.

9. The chip package structure of claim 6, further comprising at least one dummy solder material portion located on a respective one of the at least one dummy metal bonding structure and not contacting any of the second metal bonding structures.

10. The chip package structure of claim 9, wherein all surfaces of the at least one dummy solder material portion are in contact with the underfill material portion or the at least one dummy metal bonding structure.

11. The chip package structure of claim 9, wherein the at least one dummy solder material portion has a same material composition as the first solder material portions.

12. The chip package structure of claim 9, wherein the at least one dummy solder material portion comprises at least one row of dummy solder material portions arranged along a direction that is parallel to, and is located between, a pair of sidewalls of a neighboring pair of semiconductor dies selected from the plurality of semiconductor dies.

13. The chip package structure of claim 6, further comprising a molding compound die frame laterally surrounding the plurality of semiconductor dies and comprising a molding compound material.

14. The chip package structure of claim 13, wherein the molding compound die frame comprises sidewalls that are vertically coincident with sidewalls of the redistribution structure.

15. The chip package structure of claim 6, wherein the redistribution structure comprises:
   redistribution wiring interconnects embedded in redistribution dielectric layers and electrically connected to a respective one of the redistribution-side bonding structures; and
   fan-out metal bonding structures located on an opposite side of the redistribution-side bonding structures.

16. A chip package structure, comprising:
   a fan-out package including a redistribution structure comprising a plurality of first metal bonding structures on a side, a plurality of semiconductor dies comprising a plurality of second metal bonding structures that are attached to the first metal bonding structures through first solder material portions, and an underfill material portion which comprises a horizontally-extending portion that laterally surrounds the first metal bonding structures and the second metal bonding structures of the plurality of semiconductor dies,
   wherein the plurality of semiconductor dies comprises a first semiconductor die having a first sidewall and a second semiconductor die having a second sidewall and disposed apart from the first semiconductor die in a plan view,
   wherein a gap region laterally bounded by four vertical planes connecting two vertically-extending edges of the first sidewall and two vertically-extending edges of the second sidewall is present between the first sidewall and the second sidewall,
   wherein the first underfill material portion further comprises a vertically-extending portion that is adjoined to the horizontally-extending portion, contacts the first sidewall and the second sidewall, fills an entirety of a volume of the gap region that is vertically bounded by a horizontal plane including top surfaces of the first semiconductor die and the second semiconductor die and by the horizontally-extending portion and laterally bounded by the four vertical planes,
   wherein a subset of the first metal bonding structures comprises at least one dummy metal bonding structure having a respective top surface of which an entire area is contacted by a respective dummy solder material portion,
   wherein the at least one dummy metal bonding structure is located entirely within an area of the vertically-extending portion of the underfill material portion in the plan view; and
   a package substrate that is attached to the fan-out package via an array of second solder material portions.

17. The chip package structure of claim 16, wherein all surfaces of each of the dummy solder material portion are in direct contact with a respective one of the dummy metal bonding structure or in direct contact with the underfill material portion.

18. The chip package structure of claim 16, wherein the at least one dummy metal bonding structure is located between a neighboring pair of semiconductor dies selected from the plurality of semiconductor dies in a plan view.

19. The chip package structure of claim 16, wherein the at least one dummy metal bonding structure does not have any areal overlap with any of the plurality of semiconductor dies in a plan view.

20. The chip package structure of claim 19, wherein the at least one dummy solder material portion comprises at least one row of dummy solder material portions arranged along a direction that is parallel to, and is located between, a pair of sidewalls of a neighboring pair of semiconductor dies selected from the plurality of semiconductor dies.

* * * * *